(12) United States Patent
Maeda

(10) Patent No.: US 7,726,546 B2
(45) Date of Patent: Jun. 1, 2010

(54) BONDING APPARATUS AND BONDING METHOD

(75) Inventor: Toru Maeda, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 0 days.

(21) Appl. No.: 12/526,725

(22) PCT Filed: Feb. 26, 2008

(86) PCT No.: PCT/JP2008/053328

§ 371 (c)(1),
(2), (4) Date: Aug. 11, 2009

(87) PCT Pub. No.: WO2008/105426

PCT Pub. Date: Sep. 4, 2008

(65) Prior Publication Data

US 2010/0089980 A1    Apr. 15, 2010

(30) Foreign Application Priority Data

Feb. 28, 2007   (JP) .............................. 2007-049716

(51) Int. Cl.
*B23K 31/02* (2006.01)
*H01L 21/44* (2006.01)
(52) U.S. Cl. .............................. 228/180.22; 228/248.1; 438/613
(58) Field of Classification Search ........................ None
See application file for complete search history.

(56) References Cited

U.S. PATENT DOCUMENTS

| | | | |
|---|---|---|---|
| 5,547,530 A * | 8/1996 | Nakamura et al. ....... | 156/89.15 |
| 5,597,110 A * | 1/1997 | Melton et al. ............ | 228/203 |
| 6,015,083 A * | 1/2000 | Hayes et al. ............. | 228/254 |
| 6,798,072 B2 * | 9/2004 | Kajiwara et al. ......... | 257/778 |
| 7,264,991 B1 * | 9/2007 | Lin ........................... | 438/106 |

(Continued)

FOREIGN PATENT DOCUMENTS

JP    09326416    12/1997

(Continued)

OTHER PUBLICATIONS

International Search Report dated May 1, 2008 from corresponding PCT/JP2008/053328.

*Primary Examiner*—Kiley Stoner
(74) *Attorney, Agent, or Firm*—Katten Muchin Rosenman LLP

(57) ABSTRACT

A bonding apparatus (10) that bonds an electrode of a semiconductor die (12) and an electrode of a circuit board (19) using a metal nano paste includes a bump formation mechanism (20) that forms bump by injecting microdroplets of a metal nano paste on each electrode, a primary bonding mechanism (50) that carries out primary bonding to the electrodes in a non-conductive state by pressing the bump of the semiconductor die (12) against the bump of the circuit board (19), and a secondary bonding mechanism (80) that includes a pressurizing unit that pressurizes the primary bonded bump in bonding direction, and that carries out secondary bonding so that the electrodes become conductive by heating the bump up to a temperature higher than a binder removal temperature of the metal nano paste and a dispersant removal temperature of the metal nano paste, removing the binder and the dispersant, and pressurizing and sintering the metal nanoparticles in the bump. With this, it is possible to efficiently bond the electrodes with a simple and easy way while reducing a bonding load.

28 Claims, 14 Drawing Sheets

U.S. PATENT DOCUMENTS

| | | | |
|---|---|---|---|
| 7,371,674 B2 * | 5/2008 | Suh et al. | 438/612 |
| 7,393,771 B2 * | 7/2008 | Hozoji et al. | 438/610 |
| 7,600,667 B2 * | 10/2009 | Hwang | 228/180.22 |
| 2003/0222343 A1 * | 12/2003 | Sakaida | 257/737 |
| 2004/0245648 A1 * | 12/2004 | Nagasawa et al. | 257/772 |
| 2005/0110161 A1 * | 5/2005 | Naito et al. | 257/778 |
| 2006/0160330 A1 | 7/2006 | Kobayashi et al. | |
| 2007/0080758 A1 * | 4/2007 | Nagano | 333/187 |
| 2007/0216012 A1 * | 9/2007 | Hozoji et al. | 257/690 |

FOREIGN PATENT DOCUMENTS

| | | |
|---|---|---|
| JP | 10150075 | 6/1998 |
| JP | 2004327908 A | 11/2004 |
| JP | 2004342716 A * | 12/2004 |
| JP | 2005203468 A | 7/2005 |
| JP | 2006054212 | 2/2006 |
| JP | 2006202938 | 8/2006 |
| JP | 2007208082 A | 8/2007 |

\* cited by examiner

BONDING APPARATUS AND BONDING METHOD

TECHNICAL FIELD

The present invention relates to bonding apparatuses and methods of bonding electrodes using a metal nano paste.

BACKGROUND ART

A method for bonding an electrode of an electronic component, such as a semiconductor die, and an electrode in a circuit pattern on a circuit board is described in Japanese Patent Application Publication No. H09-326416, through the formation of a solder bump on an electrode pad of the electronic component, positioning the electronic component such that the formed solder bump faces down toward the electrode on the circuit board, and heating the solder bump, thereby bonding the electrodes. A method for bonding an electrode of an electronic component is also described in Japanese Patent Application Publication No. H10-150075. This publication describes a flip-chip bonding method of applying an electrically conductive bonding agent over a surface of a gold bump formed on an electrode surface of an electronic component such as a semiconductor die, flipping the semiconductor die to press the gold bump against an electrode of a circuit board, and then heating the bonding portion to bond the electrode of the semiconductor die to the electrode of a circuit pattern of the circuit board.

However, when attempting to bond electronic components in a three-dimensional stacking manner using soldering as with the conventional technique described in Japanese Patent Application Publication No. H09-326416, a previously bonded portion can often be fused due to heat applied when bonding, reducing reliability in bonding. Thus, various methods using a metal paste including ultrafine metallic particles have been proposed as a method of bonding electrodes without using solder bumps.

Japanese Patent Application Publication No. H09-326416 proposes a method of electrically bonding a semiconductor element and a circuit board, by forming a ball of a silver fine particle paste prepared by dispersing ultrafine silver powder in a solvent on a terminal electrode of a circuit board, bonding an electrode of a semiconductor element onto the ball formed on the terminal electrode of the circuit board in a face down method, and then sintering at a temperature of 100 to 250 degrees Celsius after a solvent such as toluene in the silver fine particle paste is evaporated. It is described that, according to this method, when the sintering temperature is from 200 to 250 degrees Celsius, the electrical bonding can be realized by sintering for 30 minutes in a hot-blast stove.

Japanese Patent Application Publication No. 2006-54212 describes a method of metal bonding, by printing a metal nanoparticle paste including metal nanoparticles having an average particle diameter of 30 nm or smaller and a dispersant over a surface of an electrode of a substrate, then heat curing the metal nano paste to form a metal nanoparticle film of the sintered metal nanoparticles over the surface of the electrode of the substrate, and carrying out ultrasonic bonding of a bump formed on an electrode of a semiconductor die to the metal nanoparticle film. It is described that, according to this method, the metal nanoparticles are fusion bonded to each other by the heat curing where the metal nanoparticle paste applied to the electrode on the substrate is heated up to and retained at 250 degrees Celsius using a heating device for 30 minutes, thereby forming the metal nanoparticle film over the electrode.

Japanese Patent Application Publication No. 2006-202938 discloses a method of bonding a metal layer of a semiconductor element and a metal substrate using a metal nano paste made of ultrafine particles of metal having an average diameter of 100 nm or smaller dispersed in an organic solvent. According to this bonding method, the metal included in the metal layer of the semiconductor element, the metal substrate, and the metal nano paste is one of metals including gold, silver, platinum, copper, nickel, chromium, iron, lead, and cobalt, an alloy including at least one of the metals, or a mixture of the metals or the alloy, and the metal layer of the semiconductor element and the metal substrate are bonded with a bonding layer interposed therebetween, which is formed by volatilizing the solvent to agglutinate the ultrafine particles by applying heat, pressure, or a combination thereof. Japanese Patent Application Publication No. 2006-202938 describes that, when a silver metal layer of the semiconductor element is bonded onto a copper metal substrate using a silver nano paste as the metal nano paste, the silver metal layer of the semiconductor element and the copper metal substrate can be bonded by applying a pressure such that a plane pressure between the semiconductor element and the metal substrate is on the order of several hundreds kPa to several MPa, and heating up to about 300 degrees Celsius.

Moreover, Japanese Patent Application Publication No. H10-150075 describes a flip-chip bonding method using an electrically conductive bonding agent, leveling gold bumps formed on an electrode of a semiconductor die to a height within a range of variations of 5 µm, and by correctly controlling a distance to an electrically conductive bonding agent. When the semiconductor die is flipped, an adequate amount of the electrically conductive bonding agent can be transferred to a tip end of a gold bump, and thus it is possible to prevent defects such as a bridge and a bonding defect.

According to the conventional techniques described in Japanese Patent Application Publication No. H09-326416 and Japanese Patent Application Publication No. 2006-202938, when bonding electronic components such as electrodes of semiconductor elements using a metal nano paste, it is necessary to apply a pressure to a bonding surface and maintain a temperature of about 200 to 300 degrees Celsius for 30 to 60 minutes. However, when bonding a circuit board of a semiconductor die, the bonding of a large number of semiconductor dies is required to be carried out in a short period of time. Therefore, maintaining such conditions for such a long period of time in the middle of a bonding step significantly reduces production efficiency.

According to a method described in Japanese Patent Application Publication No. 2006-54212 for forming a metal nanoparticle film over a substrate electrode and metal bonding a bump formed on the electrode of the semiconductor die to the film by ultrasonic bonding, a force exerted on the semiconductor die or the circuit board when bonding increases as the metals are bonded by ultrasonic bonding. However, with the recent demand for thinned semiconductor devices, semiconductor dies and circuit boards have become extremely thin and may be damaged by such a load when bonding. Therefore reduction of the bonding load is desirable.

According to the conventional technique described in Japanese Patent Application Publication No. H10-150075, an apparatus and a step of applying electrically conductive bonding agent for bonding between an electrode of a semiconductor die and an electrode of circuit board. As described, in order to bond the electrodes well, a variation in height of gold bumps formed on the electrode of the semiconductor die must be suppressed, and an adequate amount of electrically conductive bonding agent must be transferred to a tip end of a minute gold bump. This makes the apparatus complicated for controlling a position of a gold bump when forming the gold bump and transferring the electrically conductive bonding agent.

An object of the present invention is to provide an apparatus and a method, whereby the bonding load between an electrode of a semiconductor die and an electrode of a substrate can be reduced, and bonding between the electrodes can effectively be carried out in a simple and easy way.

SUMMARY OF INVENTION

A bonding apparatus according to the present invention bonds an electrode of a semiconductor die with an electrode of a substrate, and is configured to include: a primary bonding mechanism that carries out primary bonding to the electrodes in a non-conductive state by pressing a bump formed by injecting microdroplets of a metal nano paste, in which metal nanoparticles surface-coated by a dispersant are contained in a binder in a paste form, on to one of the electrodes against the other electrode; and a secondary bonding mechanism that includes a pressurizing unit that pressurizes the primary bonded bump in a bonding direction, and that carries out secondary bonding so that the electrodes become conductive by heating the bump up to a temperature higher than a binder removal temperature of the metal nano paste and a dispersant removal temperature of the metal nano paste, thereby removing the binder and the dispersant while pressurizing and sintering the metal nanoparticles in the bump.

A bonding apparatus according to the present invention bonds an electrode of a semiconductor die with an electrode of a substrate, and is configured to include: a primary bonding mechanism that carries out primary bonding to the electrodes in a non-conductive state by pressing bumps formed by injecting microdroplets of a metal nano paste in which metal nanoparticles surface-coated by a dispersant are contained in a binder in a paste form on the electrodes against each other; and a secondary bonding mechanism that includes a pressurizing unit that pressurizes the primary bonded bump in a bonding direction, and that carries out secondary bonding so that the electrodes become conductive by heating the bump up to a temperature higher than a binder removal temperature of the metal nano paste and a dispersant removal temperature of the metal nano paste, thereby removing the binder and the dispersant while pressurizing and sintering the metal nanoparticles in each bump.

A bonding apparatus according to the present invention bonds semiconductor dies in a three dimensional manner, and is configured to include: a primary bonding mechanism that carries out primary bonding to electrodes in a non-conductive state by pressing a bump formed by injecting microdroplets of a metal nano paste, in which metal nanoparticles surface-coated by a dispersant are contained in a binder in a paste form, on an electrode of a semiconductor die against a bump formed by injecting microdroplets of the metal nano paste on an electrode of a different semiconductor die; and a secondary bonding mechanism that includes a pressurizing unit that pressurizes the primary bonded bump in a bonding direction, and that carries out secondary bonding so that the electrodes become conductive by heating the bump up to a temperature higher than a binder removal temperature of the metal nano paste and a dispersant removal temperature of the metal nano paste, thereby removing the binder and the dispersant while pressurizing and sintering the metal nanoparticles in each bump.

A bonding apparatus according to the present invention bonds an electrode of a semiconductor die with an electrode of a substrate, and is configured to include: a primary bonding mechanism that carries out primary bonding to the electrodes in a non-conductive state by pressing a bump formed by injecting microdroplets of a metal nano paste, in which metal nanoparticles surface-coated by a dispersant are contained in a binder in a paste form, on one of the electrodes against a metal projection formed on the other electrode; and a secondary bonding mechanism that includes a pressurizing unit that pressurizes the primary bonded bump in a bonding direction, and that carries out secondary bonding so that the electrodes become conductive by heating the bump up to a temperature higher than a binder removal temperature of the metal nano paste and a dispersant removal temperature of the metal nano paste, thereby removing the binder and the dispersant while pressurizing and sintering the metal nanoparticles in the bump.

In the bonding apparatus according to the present invention, it is preferable that the pressurizing unit is provided with holding plates that are disposed so as to face each other and hold one of the semiconductor die and the substrate, a holding plate driving unit that drives at least one of the holding plates to move forward and backward in a bonding direction, and a pressurization control unit that controls the forward and backward movement of the holding plate driving unit, and the pressurization control unit includes pressurizing force changing means that changes the pressurizing force applied to the bump by causing the holding plate driving unit to drive the holding plate forward and backward according to time, or that the pressurizing force changing means includes constriction formation means that pulls the pressurized and sintered bump in a bonding direction by making the pressurizing force applied to the bump negative after a predetermined period of time elapses, thereby forming a constriction in the bump at a center in bonding direction.

In the bonding apparatus according to the present invention, it is preferable that the secondary bonding mechanism is a heating furnace that contains the pressurizing unit, that pressurizes the primary bonded bump in a bonding direction, and a plurality of secondary bonding mechanisms. Alternatively, the plurality of secondary bonding mechanisms are provided.

A bonding method according to the present invention is a method of bonding an electrode of a semiconductor die with an electrode of a substrate, and is configured to include: a primary bonding step of carrying out primary bonding to the electrodes in a non-conductive state by pressing a bump formed by injecting microdroplets of a metal nano paste, in which metal nanoparticles surface-coated by a dispersant are contained in a binder in a paste form, on one of the electrodes against the other electrode; and a secondary bonding step of carrying out secondary bonding so that the electrodes become conductive by changing the pressurizing force that pressurizes the primary bonded bump in a bonding direction according to time, heating the bump up to a temperature higher than a binder removal temperature of the metal nano paste and a dispersant removal temperature of the metal nano paste, thereby removing the binder and the dispersant while pressurizing and sintering the metal nanoparticles in the bump.

A bonding method according to the present invention is a method of bonding an electrode of a semiconductor die with an electrode of a substrate, and is configured to include: a primary bonding step of carrying out primary bonding to the electrodes in a non-conductive state by pressing bumps formed by injecting microdroplets of a metal nano paste, in which metal nanoparticles surface-coated by a dispersant are contained in a binder in a paste form, on to the electrodes positioned against each other; and a secondary bonding step of carrying out secondary bonding so that the electrodes become conductive by changing the pressurizing force that pressurizes the primary bonded bump in a bonding direction according to time, heating each bump up to a temperature higher than a binder removal temperature of the metal nano paste and a dispersant removal temperature of the metal nano paste, thereby removing the binder and the dispersant while pressurizing and sintering the metal nanoparticles in each bump.

A bonding method according to the present invention is a method of bonding semiconductor dies in a three dimensional manner, and is configured to include: a primary bonding step of carrying out primary bonding to electrodes in a non-conductive state by pressing a bump formed by injecting microdroplets of a metal nano paste, in which metal nanoparticles surface-coated by a dispersant are contained in a binder in a paste form, on to an electrode of a semiconductor die against a bump formed by injecting microdroplets of the metal nano paste on an electrode of a different semiconductor die; and a secondary bonding step of carrying out secondary bonding so that the electrodes become conductive by changing the pressurizing force that pressurizes the primary bonded bump in a bonding direction according to time, heating each bump up to a temperature higher than a binder removal temperature of the metal nano paste and a dispersant removal temperature of the metal nano paste, thereby removing the binder and the dispersant while pressurizing and sintering the metal nanoparticles in each bump.

A bonding method according to the present invention is a method of bonding an electrode of a semiconductor die with an electrode of a substrate, and is configured to include: a primary bonding step of carrying out primary bonding to the electrodes in a non-conductive state by pressing a bump formed by injecting microdroplets of a metal nano paste, in which metal nanoparticles surface-coated by a dispersant are contained in a binder in a paste form, on one of the electrodes against a metal projection formed on the other electrode; and a secondary bonding step of carrying out secondary bonding so that the electrodes become conductive by changing the pressurizing force that pressurizes the primary bonded bump in bonding direction according to time, heating the bump up to a temperature higher than a binder removal temperature of the metal nano paste and a dispersant removal temperature of the metal nano paste, thereby removing the binder and the dispersant while pressurizing and sintering the metal nanoparticles in the bump.

In the bonding method according to the present invention, it is preferable that the secondary bonding step includes pulling of the pressurized and sintered bump in a bonding direction by making the pressurizing force applied to the bump negative after a predetermined period of time elapses, thereby forming a constriction in the bump at a center in the bonding direction.

The bonding apparatus and the bonding method according to the present invention are advantageous in that it is possible to efficiently bond each electrode with a simple and easy way while reducing a bonding load between the electrode of the semiconductor die and the electrode of the substrate.

DESCRIPTION OF EMBODIMENTS

Figure 1:
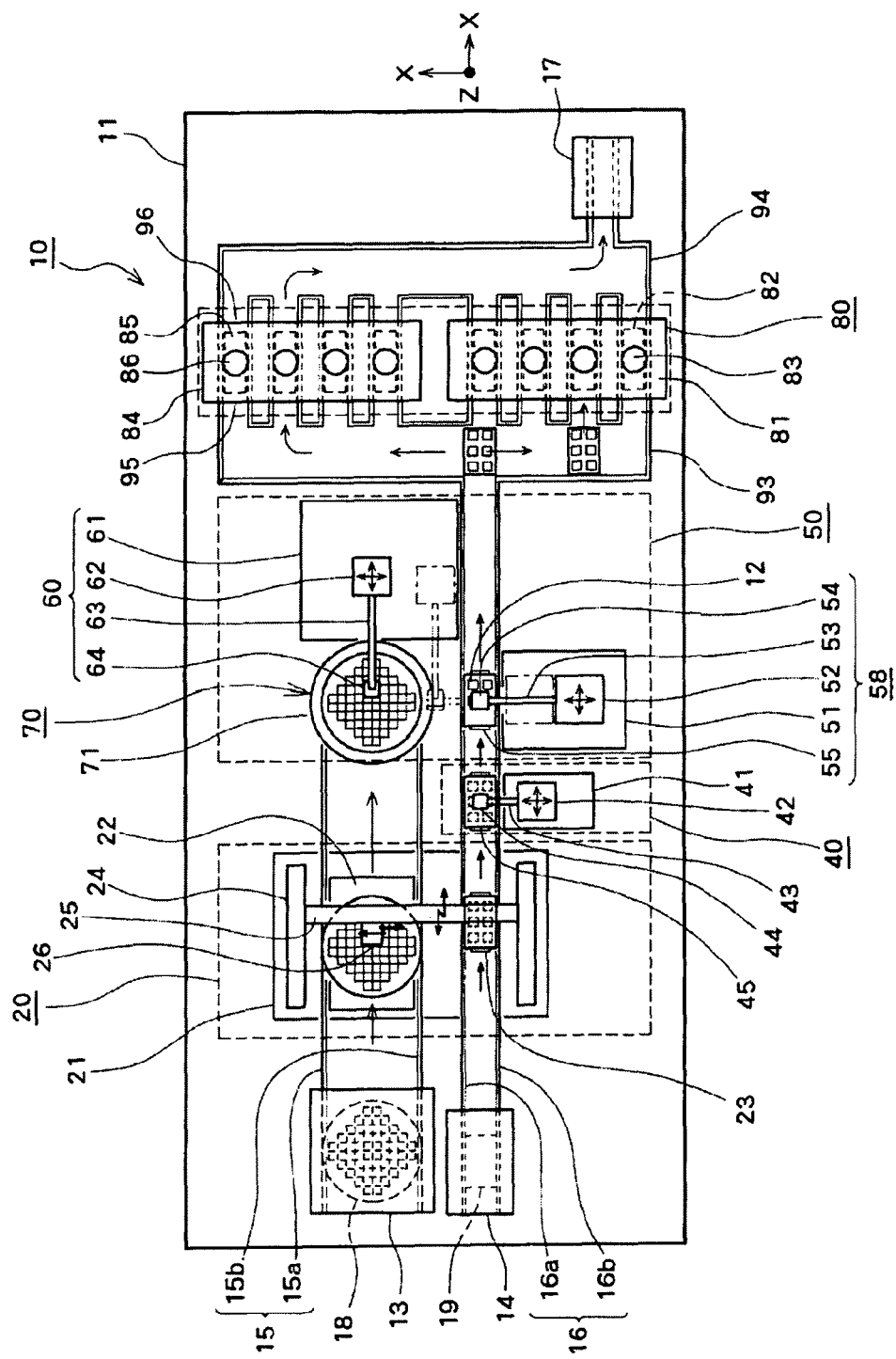
FIG. 1 is a plan view illustrating a bonding apparatus according to an exemplary embodiment of the present invention.

The following describes an exemplary embodiment according to the present invention with reference to the drawings. As shown in FIG. 1, a bonding apparatus 10 according to this exemplary embodiment is provided with a bump formation mechanism 20 disposed in a frame 11, an underfill material application mechanism 40, a primary bonding mechanism 50, and a secondary bonding mechanism 80. The secondary bonding mechanism 80 is provided with two pressure heating furnaces which are a first pressure heating furnace 81 and a second pressure heating furnace 84. A wafer magazine 13 that feeds a wafer 18 and a substrate magazine 14 that feeds a circuit board 19 are provided on a workpiece feeding side which is on a left side of the bonding apparatus 10 in FIG. 1, and a product magazine 17 that stores a finished product is provided on a product carry-out side which is on a right side of the bonding apparatus 10 in FIG. 1. The wafer magazine 13, a bump formation mechanism 20, and the primary bonding mechanism 50 are connected so as to be able to carry the wafer 18 along a wafer carrier rail 15, and the substrate magazine 14, the bump formation mechanism 20, the underfill material application mechanism 40, the primary bonding mechanism 50, and the secondary bonding mechanism 80 are connected so as to be able to carry a circuit board to each mechanism sequentially along a substrate carrier rail 16 that carries the circuit board 19. Also, the substrate carrier rail 16 is connected to the secondary bonding mechanism 80 by way of a secondary bonding mechanism entrance rail 93 and configured to be able to carry the circuit board 19 from the primary bonding mechanism 50 to the secondary bonding mechanism 80, a secondary bonding mechanism exit rail 94 connects an outlet of the secondary bonding mechanism 80 with the product magazine 17 and configured to be able to carry the circuit board 19 to which a semiconductor die 12 has been bonded from the secondary bonding mechanism 80 to the product magazine 17. In the following description, an explanation is given provided that a direction indicated by an arrow X in FIG. 1 along which the wafer 18 or a substrate 19 is carried respectively along the carrying rails 15 and 16 of the bonding apparatus 10 is X direction, a direction indicated by an arrow Y in FIG. 1 and perpendicular to both of the carrying rails 15 and 16 is Y direction, and a heightwise direction that is vertical in FIG. 1 with respect to a plane of paper is Z direction.

The wafer magazine 13 is provided with a rack in which a plurality of the diced wafers 18 are contained in a casing, and sends the wafer 18 placed either on the carrying rail 15 connected to the wafer magazine 13 or a carrier device that is not depicted to the bump formation mechanism 20 as needed. The wafer 18 of a diameter of 8 inches has a size with which about 400 of the semiconductor dies 12 can be obtained. Also, the wafer 18 is configured such that each semiconductor die 12 will not be separated after dicing and the wafer 18 can be handled as a whole by applying an adhesive tape to a back surface of the wafer and by leaving an un-diced portion between the semiconductor dies 12 so that the semiconductor dies 12 can be held as a whole onto the back side to which the adhesive tape is applied in a dicing step in which the wafer 18 is diced into the semiconductor dies 12.

The substrate magazine 14 is provided with a rack in which a plurality of the circuit boards 19 are contained in a casing, and sends the circuit board 19 placed on the substrate carrier rail 16 connected to the substrate magazine 14 to the bump formation mechanism 20 as needed. The circuit board is such that a connection circuit for connecting the semiconductor die 12 is printed on a resin substrate made of such as glass epoxy by a metal such as copper.

Instead of being fed as the wafer 18, the semiconductor dies 12 can be fed as a workpiece such that the semiconductor dies 12 are disposed on a tray after being diced into the semiconductor dies 12. In this case, similarly to the substrate magazine 14, a tray magazine provided with a rack in which a plurality of trays are contained can be provided. Also, the bonding apparatus 10 can be configured such that the workpieces are always kept being fed by providing more than one wafer magazine 13 and more than one substrate magazine 14.

Figure 2:
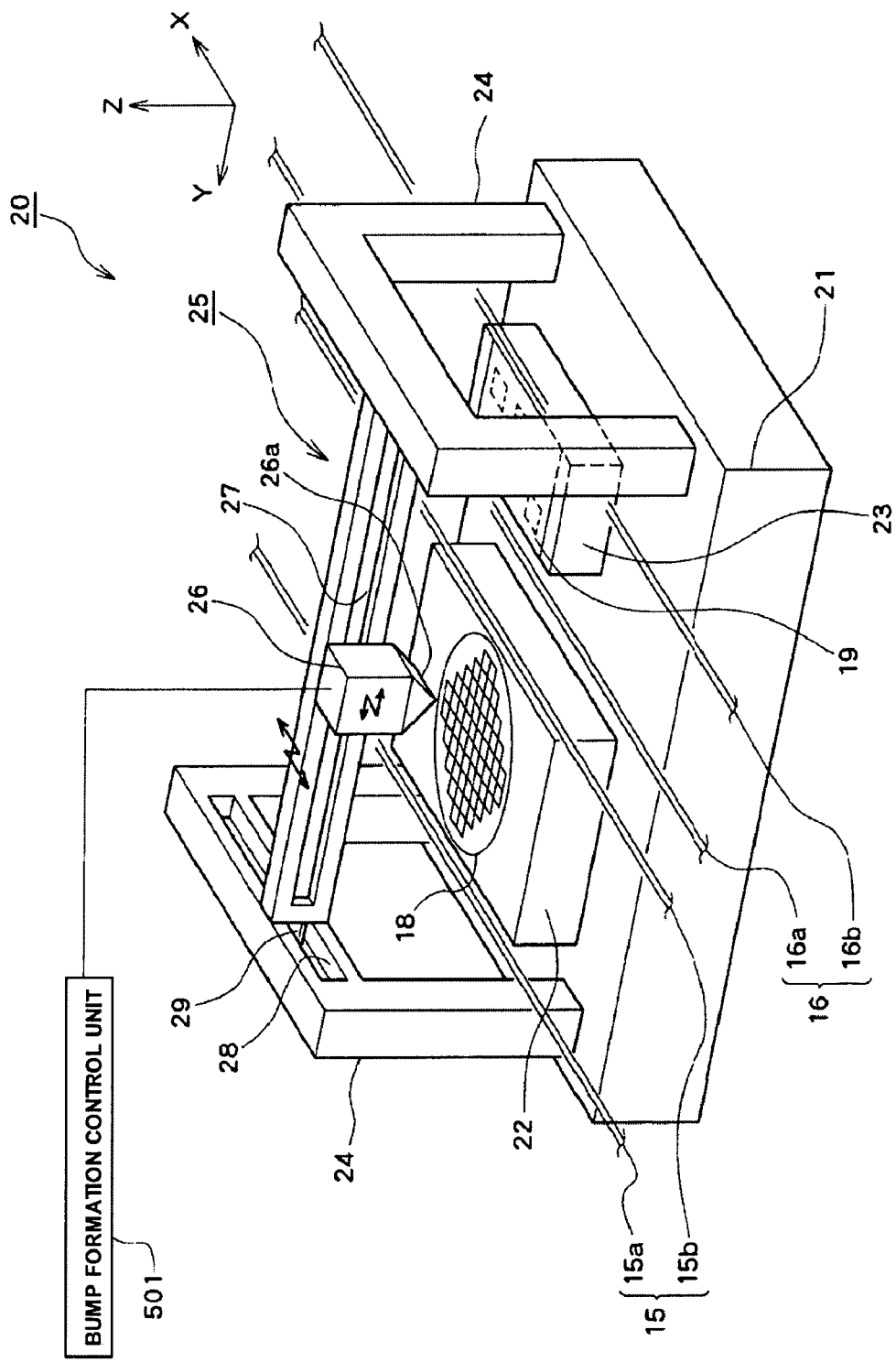
FIG. 2 is a perspective view illustrating a bump formation mechanism of the bonding apparatus according to an exemplary embodiment of the present invention.

As shown in FIG. 2 and FIG. 1, the bump formation mechanism 20 is provided with a wafer bumping stage 22 attached to a base 21, a substrate bumping stage 23, and an XY driver 25 that drives an injection head 26 of injecting the microdroplets of the metal nano paste in X and Y directions.

The wafer bumping stage 22 is provided between the two wafer carrier rails 15a and 15b, having a size with which the wafer 18 can be fixed on an upper surface in a planar state by vacuum suction, and is provided with vacuum suction holes that are not depicted on the upper surface. The vacuum suction holes are connected to a vacuum device that is not depicted. Also, the substrate bumping stage is provided between the two substrate carrier rails 16a and 16b, having a size with which the substrate 19 can be fixed on an upper surface in a planar state by vacuum suction. The substrate bumping stage 23 is, similarly to the wafer bumping stage 22, also provided with vacuum suction holes that are not depicted on the upper surface, and each of the vacuum suction holes is connected to the common vacuum device.

The XY driver 25 is provided with the injection head 26, a Y direction frame 27, and two gate-shaped frames 24. The injection head 26 is slidably attached to the Y direction frame provided with a guide that guides the injection head 26 in Y direction which is a direction perpendicular to the carrying rails 15 and 16, and driven in Y direction by a servomotor attached to either the injection head 26 or the Y direction frame 27. The Y direction frame 27 is slidably supported at both sides by the two gate-shaped frames 24 in X direction, and driven in X direction by a servomotor attached to either the gate-shaped frame 24 or the Y direction frame 27. A bump formation control unit 501 drives each of the servomotors of the XY driver 25 based on a position signal from a position detector such as an imaging device that is not depicted, and controls a position of the injection head 26. Also, the bump formation control unit 501 controls a size of the microdroplets and an interval of injection of the microdroplets of the metal nano paste that is injected from an injection nozzle. Although this exemplary embodiment is described providing a servomotor serving as a drive source, the drive source is not limited to a servomotor and can be a drive source of a different type such as a linear motor or a stepping motor.

The injection head 26 injects the metal nano paste that is retained from an injection nozzle 26a at a tip end serving as the microdroplets of the metal nano paste, and is structured, for example, by an inkjet head and such that microdroplets are injected by a piezoelectric diaphragm or a piezoelectric actuator. As long as the microdroplets can be injected, the injection head 26 is not limited to an inkjet head, and can be suitably structured by such as a dispenser head or a micropipette.

As shown in FIG. 1, the underfill material application mechanism 40 is provided with an XY table 41, a dispenser head 42, a dispenser arm 43, a dispenser unit 44, and a dispenser stage 45.

The XY table 41 supports the dispenser head 42 on its upper surface such that the dispenser head 42 is slidable along two directions of X and Y, and the dispenser head 42 is driven within an XY plane by a servomotor attached to either the XY table 41 or the dispenser head 42. The dispenser head 42 is attached with the dispenser arm 43 that is attached with the dispenser unit 44 at a tip end of the arm. The dispenser head 42 is attached with a Z direction motor that drives the dispenser unit attached to the tip end in upward and downward directions by rotary driving the dispenser arm 43, thereby controlling height of the dispenser unit 44 from the circuit board 19 in Z direction. The dispenser unit 44 is provided with a retaining unit that retains underfill material that is not depicted and a discharge nozzle that discharges the underfill material from its tip end, and the retaining unit is connected to air pressure piping that causes the underfill material to be discharged. Also, the dispenser stage 45 is provided between the two substrate carrier rails 16a and 16b, and is configured to be able to fix the substrate 19 on an upper surface in a planar state by vacuum suction.

Upon arrival at a position of the dispenser stage 45, the circuit board 19 that is carried from the bump formation mechanism 20 along the substrate carrier rail 16 is fixed to the dispenser stage 45 by vacuum suction, and the underfill material is applied to a bonding surface of the circuit board 19 by driving the dispenser head 42 and the dispenser arm 43 to adjust a position of the discharge nozzle of the dispenser unit 44.

Although, in this exemplary embodiment, the application of the underfill material is explained to be carried out on the dispenser stage 45 that is different from the substrate bumping stage 23, the underfill material can be applied to a surface of the substrate when fixed onto the substrate bumping stage 23 by vacuum suction, or the underfill material can be applied to the semiconductor die 12 on the wafer 18 when the wafer 18 is fixed onto the wafer bumping stage 22 by vacuum suction. In such cases, the underfill material application mechanism 40 is provided within the frame 11 so that the dispenser unit 44 attached to the tip end of the dispenser arm 43 can be positioned above the bumping stages 22 and 23, respectively. Also, although, in this exemplary embodiment, the underfill material application mechanism 40 is explained to have the dispenser head 42 that can move in two directions by the XY table 41, a movement mechanism can be structured by combining a linear guide without limiting to the XY table 41 as long as the dispenser unit 44 can be moved to a predetermined position.

As shown in FIG. 1, the primary bonding mechanism 50 is provided with a wafer holder 70 that holds the wafer, a semiconductor die pickup unit 60 that picks up and flips the semiconductor die 12, and a bonding unit 58 that bonds the semiconductor die 12 onto the circuit board 19.

Figure 3:
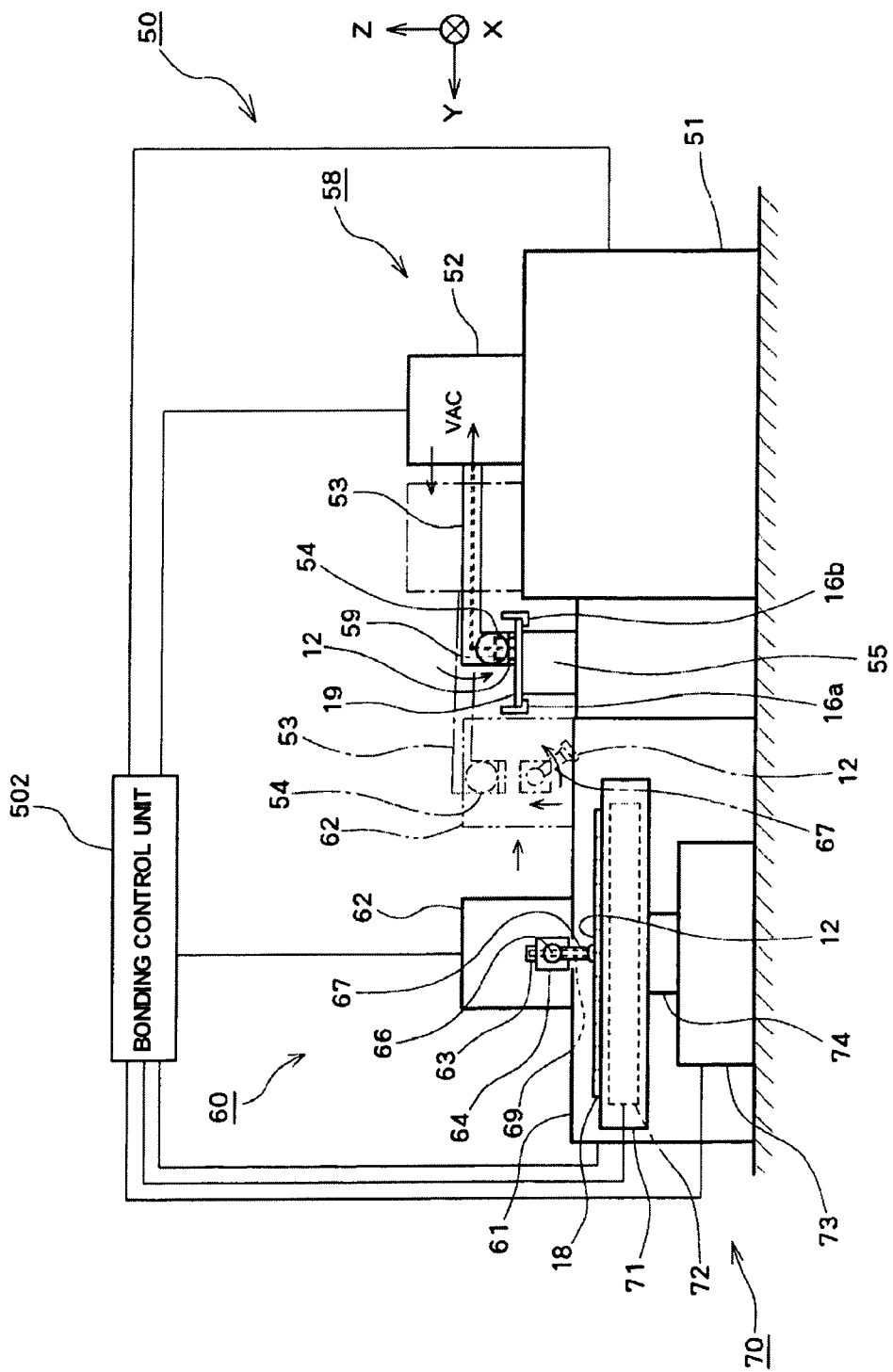
FIG. 3 is a diagram illustrating a primary bonding mechanism of the bonding apparatus according to an exemplary embodiment of the present invention.

As shown in FIG. 1, the wafer holder 70 holds the wafer 18 that is transferred from the wafer bumping stage 22 by vacuum suctioning the wafer 18 horizontally to a wafer table 71. As shown in FIG. 3, the wafer table 71 is provided therein with a die push-up unit 72 that pushes up one of the numerous semiconductor dies 12 included in the wafer 18 in Z direction so as to become projected from the remaining semiconductor dies 12. Also, the wafer table 71 is connected to a rotary drive mechanism 73 that is provided below via a connection shaft 74 and is configured to be rotary driven.

As shown in FIG. 1, the semiconductor die pickup unit 60 is disposed adjacent to the wafer holder 70, and is provided with an XY table 61, a pick-up head 62, a pick-up arm 63, and a pick-up tool 64. The XY table 61 supports the pick-up head 62 on its upper surface such that the pick-up head 62 is slidable along two directions of X and Y, and the pick-up head 62 is driven within the XY plane by a servomotor attached to either the XY table 61 or the pick-up head 62. The pick-up head 62 is attached with the pick-up arm 63 that is attached with the pick-up tool 64 at a tip end of the arm. The pick-up head 62 is attached with a Z direction motor that drives the pick-up tool 64 attached to the tip end so as to move closer to and away from the wafer 18 by rotary driving the pick-up arm 63.

As shown in FIG. 3, the pick-up tool 64 is provided with a suction collet 67 about a rotary shaft 66. The suction collet 67 includes a suction hole 69 for vacuum suction in a suction surface, and is configured such that the semiconductor die 12 can be vacuum suctioned to the suction collet 67 without being brought into contact with a bump on the electrode of the semiconductor die 12 by evacuating the air from the suction hole 69 and by pushing up the die push-up unit 72, and the semiconductor die 12 is rotated about the rotary shaft 66 while being suctioned, thereby flipping the semiconductor die 12.

As shown in FIG. 1, the bonding unit 58 is disposed adjacent to the substrate carrier rail 16, and is provided with an XY table 51, a bonding head 52, a bonding arm 53, and a bonding tool 54. The XY table 51 supports the bonding head 52 on its upper surface such that the bonding head 52 is slidable along two directions of X and Y, and the bonding head 52 is driven within the XY plane by a servomotor attached to either the XY table 51 or the bonding head 52. The bonding head 52 is attached with the bonding arm 53 that is attached with the bonding tool 54 at a tip end of the arm. The bonding head 52 is attached with a Z direction motor that drives the bonding tool 54 attached to the tip end so as to move closer to and away from the substrate 19 by rotary driving the bonding arm 53.

Also, as shown by alternate long and short dash lines in FIG. 3 and FIG. 1, the bonding unit 58 and the semiconductor die pickup unit 60 are disposed at positions at which the bonding tool 54 and the pick-up tool 64 come close to each other so that the semiconductor die 12 that has been flipped by the rotation of the suction collet 67 can be transferred to the bonding tool 54 that includes a suction hole 59 for vacuum suction.

Figure 4:
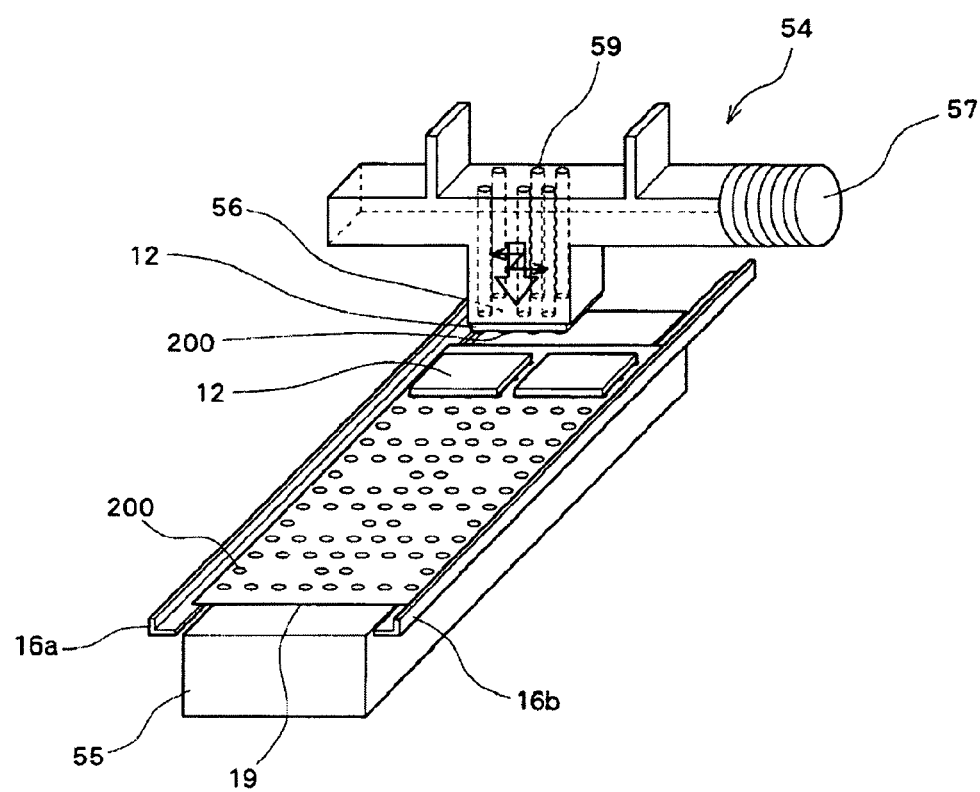
FIG. 4 is a perspective view illustrating primary bonding on a bonding stage of the bonding apparatus according to an exemplary embodiment of the present invention.

As shown in FIG. 3 and FIG. 4, a bonding stage 55 is provided between the two substrate carrier rails 16*a* and 16*b*, and is configured to be able to fix the substrate 19 on the upper surface in a planar state by vacuum suction.

As shown in FIG. 4, the bonding tool 54 is provided with a face portion 56 and an ultrasonic vibrator 57. The face portion 56 provided for the bonding tool 54 on a side of its bonding surface is configured to hold and presses the semiconductor die 12 against the substrate 19. The suction surface of the semiconductor die 12 of the face portion 56 is provided with the suction hole 59 for vacuum suction, and is configured to hold the semiconductor die 12 by vacuum suction. Also, one end of the bonding tool 54 in a longitudinal direction is attached with the ultrasonic vibrator 57, and is configured to cause the face portion 56 to vibrate along the longitudinal direction of the bonding tool 54 by ultrasonic oscillation of the vibrator . The bonding unit 58 is configured to detect a position of the circuit board 19 by an imaging device for detecting a position that is not depicted, and to press the semiconductor die 12 at a predetermined position.

As shown in FIG. 3, the XY table 51 and the bonding head 52 of the bonding unit 58, the XY table 61 and the pick-up head 62 of the semiconductor die pickup unit 60, and the die push-up unit 72 and the rotary drive mechanism 73 of the wafer holder 70 are each connected to a bonding control unit 502 and configured to be driven based on an instruction from the bonding control unit 502.

Although this exemplary embodiment is described as the semiconductor die pickup unit 60 and the bonding unit 58 being respectively provided with the XY tables 61 and 51, and configured to drive the pick-up head 62 and the bonding head 52, respectively, disposed on the corresponding tables in X and Y directions and to drive the pick-up tool 64 and the bonding tool 54, respectively, attached to the arm 63 of the head 62 and the arm 53 of the head 52 in upward and downward directions, it is possible to configure such that each of the tools 64 and 54 can be moved to a predetermined position by a combination of a plurality of linear guides as long as the pick-up tool 64 and the bonding tool 54 can be moved to the predetermined positions, instead of employing the configuration as described above. Also, it is also advantageous that the pick-up head 62 can move only in Y direction by coordinating the rotary movement of the wafer holder 70 and the pickup operation of the semiconductor die pickup unit 60.

Although the configuration according to this exemplary embodiment is such that the semiconductor die 12 that has been flipped by the rotation of the suction collet 67 of the semiconductor pickup unit 60 is directly transferred to the bonding tool 54, and thus the flipped semiconductor die 12 is held by the bonding tool 54, the configuration is not limited to this, and can be such that the semiconductor die 12 that has been picked up from the wafer 18 is suctioned to a rotary stage that is not depicted, and then transferred onto an upper surface of a pick-up stage in a flipped state by flipping the rotary stage, and the flipped semiconductor die 12 is suctioned by the bonding tool 54, thereby carrying out the bonding.

Figure 5:
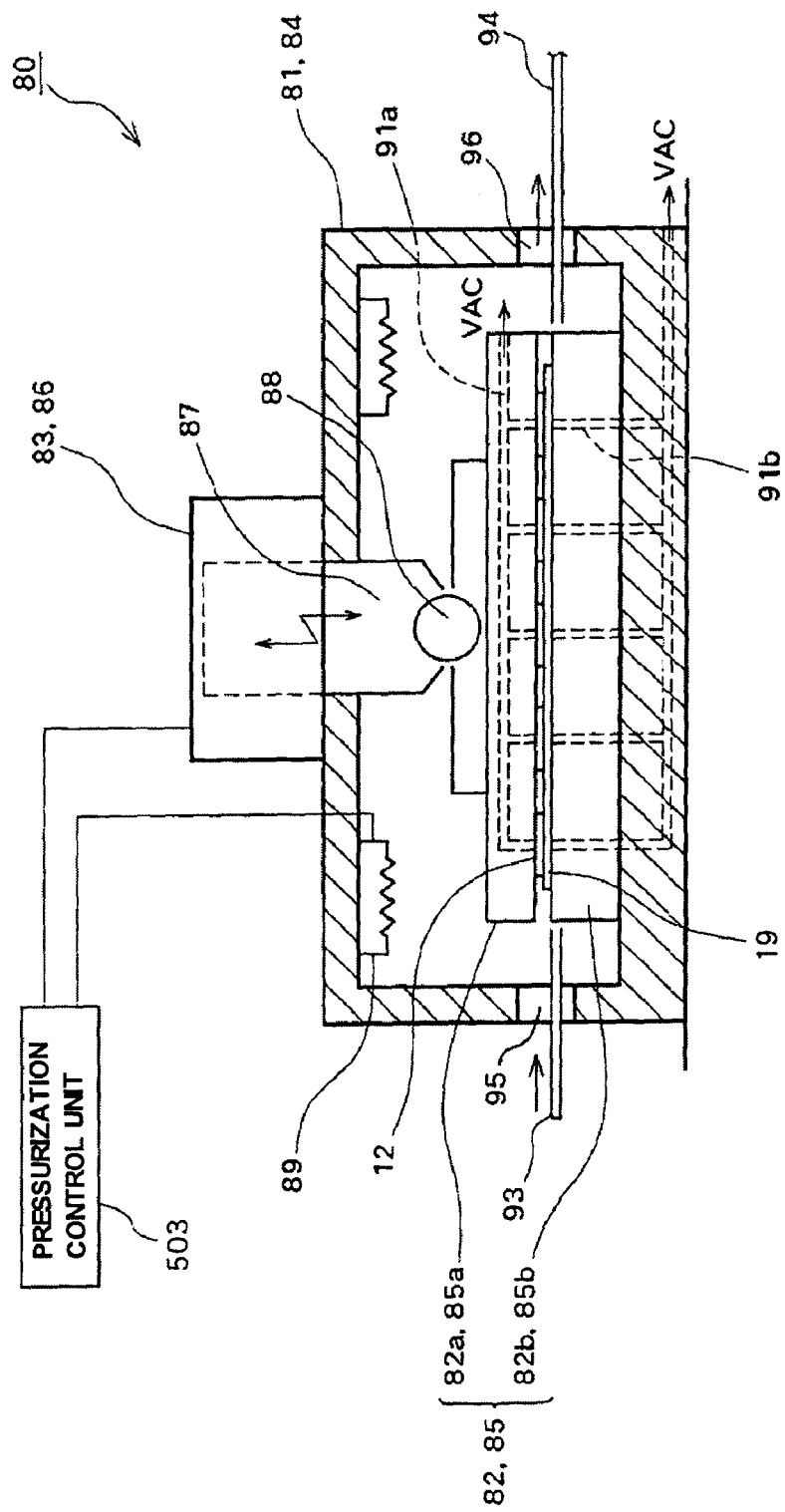
FIG. 5 is a cross-sectional view illustrating a pressure heating furnace of the bonding apparatus according to an exemplary embodiment of the present invention.

As shown in FIG. 5, a first and a second pressure heating furnaces 81, 84 are provided with upper holding plates 82a, 85a and lower holding plates 82b, 85b that sandwich the circuit board 19 and the semiconductor die 12 from top and bottom, actuators 83, 86 that drive the upper holding plates 82a, 85a forward and backward along a direction in which the semiconductor die 12 is bonded, and a heater 89 that heats inside. The actuators 83, 86 are respectively connected to the upper holding plates 82a, 85a via a driving shaft 87 and a ball joint 88 so that the circuit board 19 and the semiconductor die 12 can be evenly pressurized. Also, the lower holding plates 82b, 85b are fixed to casings of the first and the second pressure heating furnaces 81, 84. The upper holding plates 82a, 85a and the lower holding plates 82b, 85b are provided with vacuum suction holes 91a, 91b for vacuum suctioning either the semiconductor die 12 or the circuit board 19. The vacuum suction holes 91a, 91b are both connected to the vacuum device that is not depicted. Also, the first and the second pressure heating furnaces 81, 84 are each provided with a carry-in portion 95 for carrying the circuit board 19 to the holding plates 82, 85 and a carry-out portion 96 for carrying the circuit board out. Each carry-in portion 95 of the first and the second pressure heating furnaces 81, 84 is connected with the secondary bonding mechanism entrance rail 93, and each carry-out portion 96 of the first and the second pressure heating furnaces 81, 84 is connected with the secondary bonding mechanism exit rail 94.

Each of the actuators 83, 86 is connected to a pressurization control unit 503, and is configured to be driven based on an instruction from the pressurization control unit 503. The actuators 83, 86 can be electrically-operated, or can be driven forward and backward by a device such as an oil hydraulic cylinder. The heater 89 is also connected to the pressurization control unit, and temperature control for the pressure heating furnaces 81 and 84 is carried out. The heater 89 can be structured by an electric heating wire, or can be configured to introduce high-temperature heated air generated by a device such as a hot air generator that is externally provided into the pressure heating furnaces 81 and 84, thereby heating inside. Also, it is also possible to directly attach a heating device to the upper holding plates 82a, 85a and the lower holding plates 82b, 85b, and heat the semiconductor die 12 and the circuit board 19 while the semiconductor die 12 is pressed against the circuit board 19 by a pressure, thereby heating a bump 200.

Next, an operation of the bonding apparatus according to this exemplary embodiment will be described, and formation of the bump 200 on an electrode 12a, the primary bonding, and the secondary bonding are described before an operation of the bonding apparatus as a whole.

Figure 6:
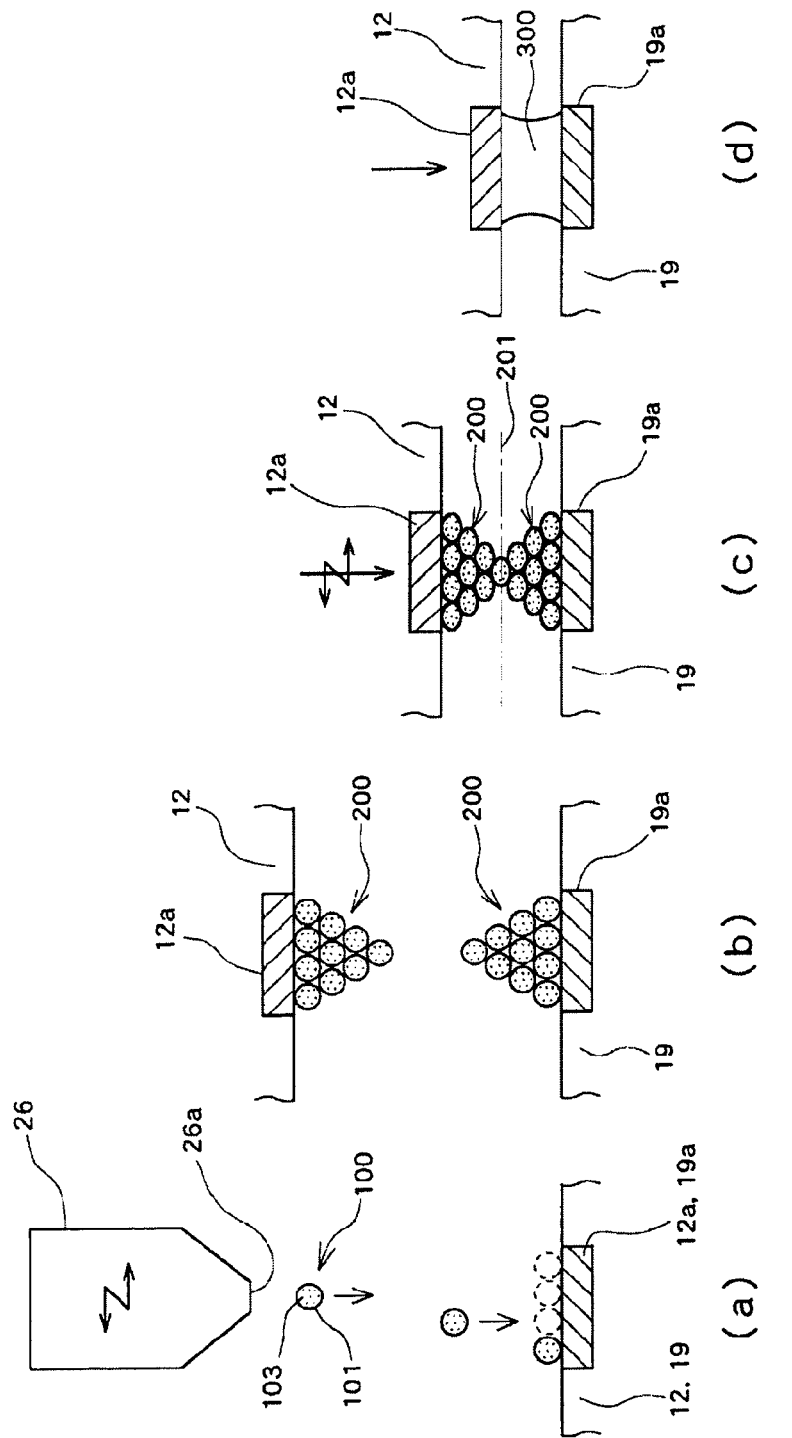
FIG. 6 is an illustrative diagram showing steps of bonding a circuit board and a semiconductor die according to a bonding method of an exemplary embodiment of the present invention.

As shown in FIG. 6(a), the formation of the bump 200 on the electrode 12a by injecting microdroplets 100 of the metal nano paste from the injection nozzle 26a of the injection head 26 to the electrode 12a. The metal nano paste is made of metal nanoparticles 103 of refined conductive metal, in which the metal nanoparticles 103 are dispersed in a binder 101 in paste form with a dispersant being coated over a surface of each of the metal nanoparticles 103. The metal nanoparticles 103 can be configured from refined conductive metals, such as gold, silver, copper, platinum, palladium, nickel, or aluminum. Alkylamine, alkanethiol, alkane diol can be used as the dispersant that is coated over the surface of each of the metal nanoparticles 103. Also, a thermosetting resin component serving as an organic binder contained in a nonpolar solvent or a low polarity solvent having a relatively high boiling point that will not be evaporated easily at around room temperature, for example a dispersion solvent such as terpineol, mineral spirits, xylene, toluene, tetradecane, or dodecane can be used as the binder 101 in paste form.

As shown in FIG. 6(a), as the microdroplets 100 of the metal nano paste are injected from the nozzle of the injection head 26, the microdroplets are attached to a surface of the electrode 12a. Then, the bump 200 having a cone shape can be formed on the electrode 12a by injecting the microdroplets 100 of the metal nano paste so as to be laminated. A position and an interval of the injection of the microdroplets of the metal nano paste from the injection head 26 is controlled by the bump formation control unit to form a bump shape that is suitable for the type of the semiconductor die 12. By employing an injection head that is used for an inkjet as the injection head 26, a large amount of the microdroplets 100 can be injected and laminated in a short period of time. In this manner, after forming the bump 200 on each of an electrode 19a and the electrode 12a respectively of the circuit board 19 and the semiconductor die 12, the semiconductor die 12 is picked up from the wafer 18 and flipped by the semiconductor die pickup unit 60 shown in FIG. 1, the flipped semiconductor die 12 is held by the bonding tool 54, and the position of the bump 200 of each of the electrodes 12a, 19a is adjusted as shown in FIG. 6(b).

As shown in FIG. 6(c), after adjusting the positions of the electrodes 12a, 19a, the primary bonding is carried out by moving the bonding tool 54 shown in FIG. 3 down toward the circuit board 19, and pressing the bump 200 formed on the electrode 12a of the semiconductor die 12 against the bump 200 formed on the electrode 19a of the circuit board 19. A pressing plane pressure in the primary bonding is a very small plane pressure that is about $\frac{1}{100}$ to $\frac{1}{200}$ of a plane pressure required to bond a metal bump to a metal electrode according to the conventional technique. When the bumps 200 are pressed against each other with such a small plane pressure, it is possible to cause only the binders that form the surfaces of the bumps 200 to be pressure bonded to each other, while the metal nanoparticles 103 contained in the binders in a dispersed manner remain unbonded. Since only the binders 101 are pressure bonded to each other in this bonding, the electrodes 12a and 19a are not electrically conductive, and remain non-conductive. Also, during the primary bonding, by causing the ultrasonic vibrator attached to the bonding tool 54 to oscillate, the semiconductor die 12 held by the bonding tool 54 is laterally vibrated, thereby causing tip ends of both bumps near a bonding line 201 to touch each other. With this, a temperature of each of the bumps 200 near the bonding line 201 increases. Then, the binders of the surfaces of the bumps 200 are fusion bonded to each other, thereby securing the bonding in the primary bonding. However, the heating by the ultrasonic vibrator and such is only required up to a temperature lower than a binder removal temperature at which organic substances in the binder are volatilized and removed.

Although, in the primary bonding, only the binders 101 on the surfaces of the bumps 200 are bonded to each other and adhesive force is weak, it is possible to obtain the strength such that the semiconductor die 12 does not split off from the circuit board 19. Also, it is possible to obtain the strength such that the semiconductor die 12 does not split off from the circuit board 19, the bump 200 formed on the plurality of the electrodes 12a of the semiconductor die 12 and the bump 200 formed on the plurality of the electrode 19a on the circuit board 19 are required to be bonded to each other only partially, and not entirely. Accordingly, the bumps 200 whose height is not very accurate are sufficient for the primary bonding. Also, as the bumps 200 can be formed by a simple and easy way such as an inkjet method, the bump formation mechanism can be simplified.

As shown in FIG. 6(d), the bump 200 is pressurized in bonding direction with the semiconductor die 12 facing toward the circuit board 19 in a state in which the semiconductor die 12 is primary bonded onto the circuit board 19, and the bump 200 in the heating furnace is heated up to a temperature higher than the removal temperature of the binder and the dispersant coated over the surface of the metal nanoparticles, for example, on the order of 150 degrees Celsius to 250 degrees Celsius. Then, the organic substances in the binder 101 are volatilized and removed, and the dispersant is separated and removed from the surface of the metal nanoparticles 103 as the temperature rises, and thus the metal nanoparticles 103 are brought into contact with each other and low-temperature sintering characteristic to the metal nanoparticles 103 starts.

In contrast, when the heating and the pressurization are carried out as described above, the surface of the metal nanoparticles 103 and a metal surface of the electrodes 12a, 19a are oxidized and reduced by the organic components contained in the binder 101 that configures the metal nano paste and the dispersant coated over the surface of the metal nanoparticles, and start to be combined with each other by agglutination of the metal nanoparticles 103. As a result, the electrodes 12a, 19a are bonded by a metal layer 300, and the electrodes become conductive. In this manner, bonding the electrodes 12a, 19a so as to be conductive with the metal layer 300 by pressurizing and sintering the metal nanoparticles 103 at a low temperature is secondary bonding. In the secondary bonding, while the metal nanoparticles 103 are sintered to each other at a very low temperature compared to a fusing temperature of common metals, the metal layer 300 after the pressurization and sintering has a characteristic that the metal layer 300 is not fused unless heated up to a temperature similar to common metals. Also, by carrying out the heating and pressurization at the same time, it is possible to remove any gas remaining between the metal nanoparticles 103, thereby obtaining the metal layer 300 that is dense.

Also, when the underfill material is applied by the underfill material application mechanism 40 shown in FIG. 1, the underfill material is filled into a gap between the semiconductor die 12 and the circuit board 19 in the primary bonding, and the underfill material that has been filled is in the secondary bonding is thermally cured and joins the semiconductor die 12 with the circuit board 19. It is possible to increase bonding strength between the semiconductor die 12 and the circuit board 19 by the underfill material.

Next, an entire operation of the bonding apparatus according to the present invention is described. As shown by Step S101 in FIG. 7, the wafer 18 that is sent out from the wafer magazine 13 is transferred to the wafer bumping stage 22, and fixed to the wafer bumping stage 22 by vacuum suction. Then, as shown by Step S102 in FIG. 7 and in FIG. 6(a), the microdroplets 100 of the metal nano paste are injected toward each of the electrodes 12a of the semiconductor dies 12 of the wafer 18 from the injection nozzle 26a, thereby forming the bumps 200. The formation of the bump 200 is controlled by the bump formation control unit 501 shown in FIG. 2. Upon completion of the formation of the bumps 200 on the electrodes 12a of all the semiconductor die 12 of the wafer 18, as shown by Step S103 in FIG. 7, the wafer 18 is transferred to the wafer holder 70. The wafer 18 transferred to the wafer holder 70 is fixed to the wafer table 71 by vacuum suction.

Figure 7:
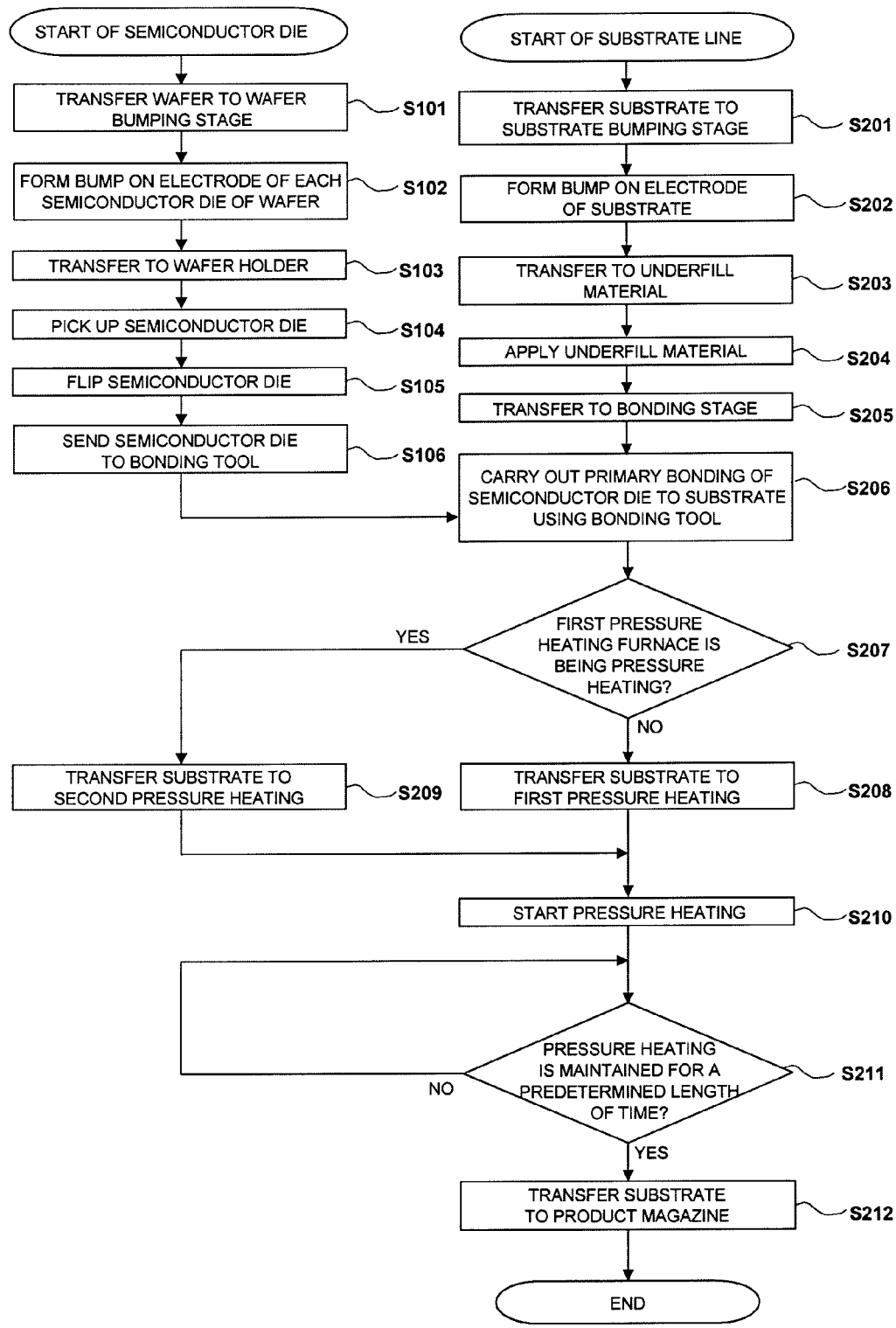
FIG. 7 is a process flowchart showing the steps of bonding according to the bonding method of an exemplary embodiment of the present invention.

As shown by Step S104 in FIG. 7 and in FIG. 3, the bonding control unit 502 causes the die push-up unit 72 to push up the selected semiconductor die 12 to move upward, and causes the suction collet 67 at the tip end of the pick-up arm 63 to pick up the semiconductor die 12 without being brought into contact with the bump 200 on the electrode of the semiconductor die 12 that has been moved up. Then, as shown by Step S105 in FIG. 7 and by an alternate long and short dash line in FIG. 3, the bonding control unit 502 causes the pick-up arm 63 to move up and the suction collet 67 to rotate by 180 degrees, thereby flipping the semiconductor die 12, and moves the pick-up head 62 toward a side of the bonding head 52 to a transfer position.

As shown by Step S106 in FIG. 7 and by the alternate long and short dash line in FIG. 3, after moving the bonding head 52 toward the pick-up head 62 until the bonding tool 54 reaches the transfer position, the bonding control unit 502 releases the vacuum of the suction surface of the suction collet 67 causing the suction surface of the bonding tool 54 to be vacuum suctioned, and transfers the semiconductor die 12 from the suction collet 67 to the bonding tool 54.

In contrast, as shown by Step S201 in FIG. 7 and in FIG. 1, the circuit board 19 is sent out from the substrate magazine 14, transferred to the substrate bumping stage 23, and fixed to the substrate bumping stage 23 by vacuum suction. Then, as shown by Step S202 in FIG. 7 and in FIG. 6(a), the bump formation control unit 501 causes the microdroplets 100 of the metal nano paste to be injected toward each of the electrodes 19a of the circuit board 19 from the injection nozzle 26a, thereby forming the bumps 200. Upon completion of the formation of the bumps 200 on all the electrodes 19a of the circuit board 19, as shown by Step S203 in FIG. 7, the circuit board 19 is transferred to the underfill material application mechanism 40, and fixed to the dispenser stage 45 by vacuum suction. Then, as shown by Step S204 in FIG. 7 and in FIG. 1, the underfill material is discharged from the nozzle of the dispenser unit 44 onto the circuit board 19 on which the bumps 200 are formed, and the underfill material is applied to the circuit board 19. As shown by Step S205 in FIG. 7 and in FIG. 1, the circuit board 19 to which the underfill material has been applied is transferred to the bonding stage 55 and fixed to the bonding stage 55 by vacuum suction.

As shown by Step S206 in FIG. 7 and in FIGS. 3 and 4, the bonding control unit 502 moves the bonding head 52 to adjust the position of the bump 200 formed on the electrode 12a of the semiconductor die 12 held by the bonding tool 54 to the position of the bump 200 formed on the electrode 19a of the circuit board 19. Then, the bonding control unit 502 moves the bonding arm 53 downward to press the bump 200 formed on the electrode 12a of the semiconductor die 12 held by the bonding tool 54 against the bump 200 formed on the electrode 19a of the circuit board 19. The bonding control unit 502 controls the Z direction motor of the bonding head 52 such that a pressurizing force in the pressing is about $\frac{1}{100}$ to $\frac{1}{200}$ of the pressurizing force required to pressure bond common metal bumps. At this time, the bonding control unit 502 causes the ultrasonic vibrator 57 to oscillate so that contacting surfaces of the bump 200 on the side of the semiconductor die 12 and the bump 200 on the side of the circuit board 19 are rubbed to produce frictional heat, and the primary bonding in which the binders of the bumps 200 are bonded as shown in FIG. 6(c) is carried out. While it is explained that the heating of each bump in this primary bonding is carried out by the frictional heat produced by the oscillation of the ultrasonic vibrator 57, heating means to heat the surface of each bump is not limited to that using the ultrasonic vibrator 57. Alternate heating means can be used as long as the surface of each bump can be heated up to a temperature that is higher than the room temperature and lower than the binder removal temperature at which the organic substances of the binder are volatilized, and at which the binder becomes soft. For example, the heating means can be configured to raise the temperature by locally blowing hot air or by radiant heat. Also, by pressing the semiconductor die 12 against the circuit board 19, the underfill material is filled into the gap between the semiconductor die 12 and the circuit board 19.

The primary bonding is only to press the semiconductor die 12 against the circuit board 19 with a small load, processing time is very short and each semiconductor die 12 can be bonded within 1 second. Because of this, primary bonding can be processed at a high speed.

The circuit board 19 to which the semiconductor die 12 is primary bonded is transferred either to the first pressure heating furnace 81 or to the second pressure heating furnace 84 by the secondary bonding mechanism entrance rail 93 shown in FIG. 1. As shown by Step S207 in FIG. 7, when the first pressure heating furnace 81 is not heating and the circuit board 19 can be transferred, as shown by Step S208 in FIG. 7, the circuit board 19 is transferred to the first pressure heating furnace 81 by the secondary bonding mechanism entrance rail 93, and transferred between the holding plates 82*a*, 82*b* of the first pressure heating furnace 81. Also, as shown by Step S207 in FIG. 7, when the first pressure heating furnace 81 is heating and the circuit board 19 cannot be transferred, as shown by Step S209 in FIG. 7, the circuit board 19 is transferred to the second pressure heating furnace 84 by the secondary bonding mechanism entrance rail 93, and transferred between the holding plates 85*a*, 85*b* of the second pressure heating furnace 84.

As shown by Step S210 in FIG. 7 and in FIG. 5, when the circuit board 19 is transferred to the predetermined one of the pressure heating furnaces 81 and 84 and positioned either between the holding plates 82*a*, 82*b* or between the holding plates 85*a*, 85*b*, the pressurization control unit 503 drives the actuator 83 or 86 to move the upper holding plate 82*a* or 85*a* downward, presses the semiconductor die 12 against the circuit board 19, and pressurizes the bumps 200 of the electrodes 12*a*, 19*a*, respectively, in bonding direction. A pressure applied when pressurizing is a low pressurizing force that is about ½₀ of a pressurizing force required to pressure bond common metal bumps. Also, the pressurization control unit 503 controls the heater 89 so as to make inner temperature within the pressure heating furnaces 81, 84 to be 150 degrees Celsius to 250 degrees Celsius which is necessary for the secondary bonding. By allowing the applied pressure to be about ½₀ of the pressurizing force required to bond the conventional metal bumps, it is advantageously possible to reduce damages to the semiconductor die 12 and the circuit board 19 even when bonding the thin semiconductor die 12 or the thin circuit board 19.

As shown by Step S211 in FIG. 7, the pressurization control unit 503 monitors whether the predetermined applied pressure and the predetermined heating temperature are maintained for a predetermined period of time. While the maintaining time differs depending on the type of the metal nano paste that is used, a maintaining time of about 60 minutes is commonly used. In addition, as shown by Step S212 in FIG. 7 and in FIG. 5, once the predetermined maintaining time has lapsed, the pressurization control unit 503 moves the actuators 83, 86 upward, and stops the pressurization to the circuit board 19 and the semiconductor die 12. Upon termination of the maintenance, the secondary bonding is completed; each electrode is bonded in a conductive manner by the metal layer 300. Also, in the secondary bonding, the underfill material is thermally cured to join the semiconductor die 12 with the circuit board 19. The circuit board 19 after the secondary bonding is completed is transferred from the carry-out portion 96 shown in FIG. 1 to the product magazine 17 by the secondary bonding mechanism exit rail 94. When a predetermined number of products are stored in the product magazine 17, the products are transferred out from the product magazine 17.

The secondary bonding process requires about 60 minutes of maintaining the pressurized and heated state in the pressure heating furnace. However, the bonding processing time for a single semiconductor die 12 can be reduced by providing two pressure heating furnaces that respectively carry out a batch process of a large number of circuit boards 19. For example, assuming all of about 800 semiconductor dies 12 that can be obtained from two 8-inch wafer are primary bonded to a plurality circuit boards 19, and the primary bonded 800 semiconductor dies 12 are placed in a single pressure heating furnace and maintained for the secondary bonding, a time period necessary of the secondary bonding of a single semiconductor die 12 is about 4.5 seconds. As a result, this advantageously improves efficiency in bonding the semiconductor dies 12.

According to this exemplary embodiment, in the primary bonding, the semiconductor die 12 and the circuit board 19 can be bonded with the pressurizing force that is about ⅟₁₀₀ to ⅟₂₀₀ of the pressurizing force required to bond the conventional metal bumps, and, in the secondary bonding, the semiconductor die 12 and the circuit board 19 can be bonded with the pressurizing force that is about ⅟₂₀ of the pressurizing force required to bond the conventional metal bumps, and therefore, the electrodes 12*a*, 19*a* respectively of the semiconductor die 12 and the circuit board 19 can be bonded with a considerably low pressurizing force compared to the bonding of the conventional metal bumps, thereby advantageously reducing damages to the semiconductor die 12 and the circuit board 19 due to the bonding. Also, according to this exemplary embodiment, the bonding is divided into two processes of the primary bonding in which the bonding process of the electrodes 12*a*, 19*a* using the metal nano paste can be carried out in a short period of time, and the secondary bonding that requires the maintenance with pressurized and heated for an extended period of time, and the primary bonding that can be carried out in a short period of time is processed continuously, and the secondary bonding that requires an extended period of time is carried out as a batch process, making it advantageously possible to reduce bonding time for a single semiconductor die 12, and to efficiently bond the semiconductor die 12 and the circuit board 19 using the metal nano paste. Also, in this exemplary embodiment, the bumps are formed by injecting the microdroplets of the metal nano paste to the electrodes 12*a*, 19*a* respectively of the semiconductor die 12 and the circuit board 19, and therefore the bump formation mechanism can be configured by an inkjet method, thereby advantageously eliminating the need for a large apparatus as in formation of conventional gold bumps and simplifying the bonding apparatus.

As described above, while the bonding apparatus 10 according to this exemplary embodiment is explained to feed serving as the wafer 18, the semiconductor die 12 or the circuit board 19 on which the bumps are not formed on the electrodes as workpieces and to carry out the formation and the bonding of the bumps 200, the bump formation mechanism 20 can be structured as an independent apparatus not included in the bonding apparatus 10. In such case, it is possible to employ a configuration such that the bumps 200 are previously formed by injecting the microdroplets of the metal nano paste by a different apparatus that includes the wafer magazine 13, the substrate magazine 14, and the bump formation mechanism 20, and the wafer 18, and the semiconductor die 12 and the circuit board 19 on which the bumps 200 have been formed are fed as workpieces to the bonding apparatus 10 that does not include the bump formation mechanism 20, and then the primary bonding and the secondary bonding are carried out, thereby obtaining the products. In this manner, by forming the bumps 200 using a different apparatus, it is advantageously possible to reduce the bonding time for a single semiconductor die 12 even when a number of bumps 200 are required to be formed on the wafer 18, and to efficiently bond the semiconductor die 12 and the circuit board 19 using the metal nano paste.

Also, a plurality of injection heads 26 can be provided within the bump formation mechanism 20. In this manner, by providing the plurality of injection heads 26, it is advantageously possible to increase a speed for forming the bumps 200, and to further reduce the bonding time for a single semiconductor die 12.

Figure 13:
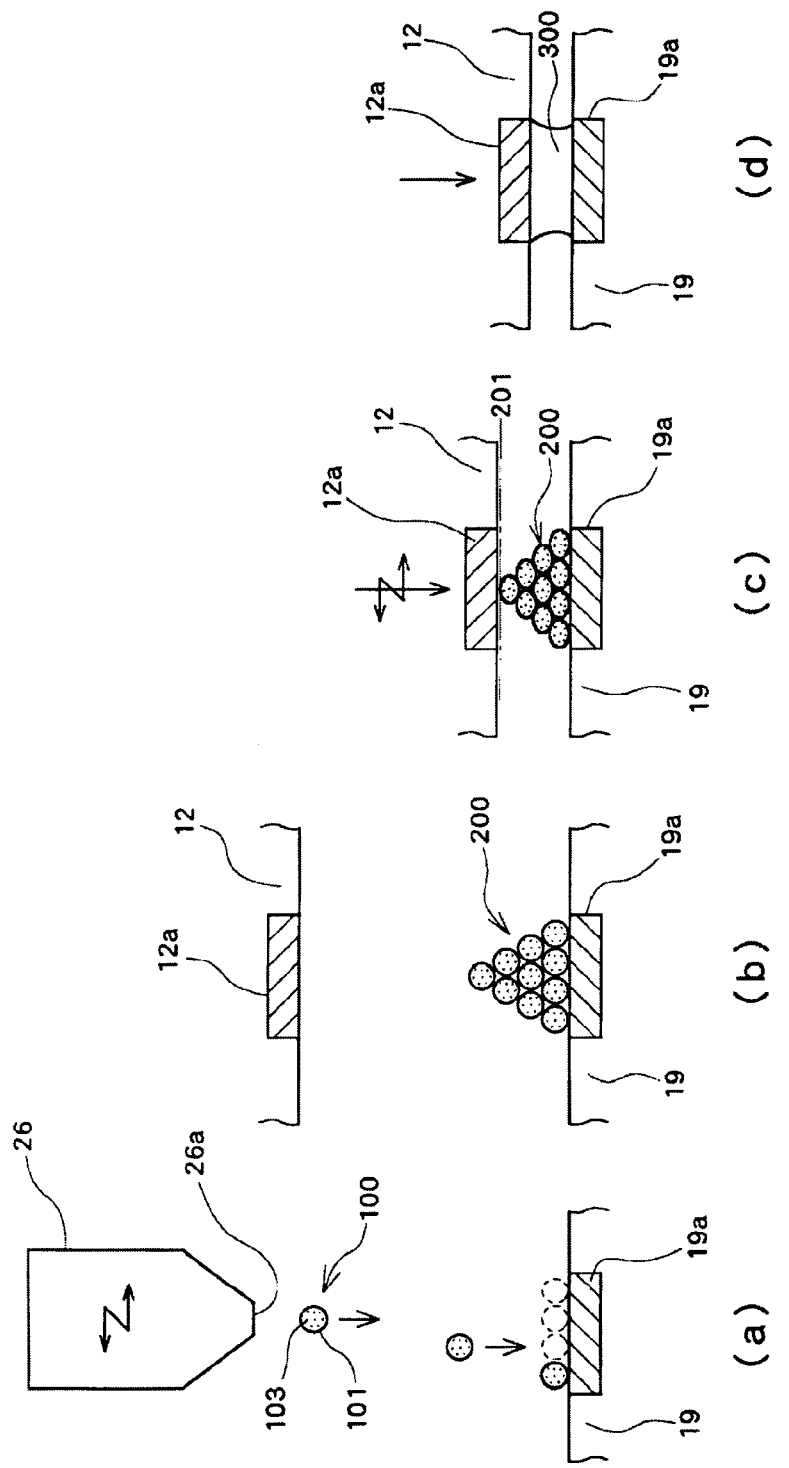
FIG. 13 is an illustrative diagram showing steps of bonding a circuit board and a semiconductor die according to a bonding method of a different exemplary embodiment of the present invention.

Although, in this exemplary embodiment, it is explained that the bump 200 is formed on each electrode and then the bonding is carried out, it is possible that, as shown in FIG. 13, the bump 200 is formed only on one of the electrodes to be bonded, the primary bonding is carried out by pressing the bump 200 against the other electrode, and then the secondary bonding is carried out for maintaining the pressurization and heating. By this, it is advantageously possible to reduce a number of the bumps 200 to be formed by half, and to further reduce the bonding time for a single semiconductor die 12.

Figure 14:
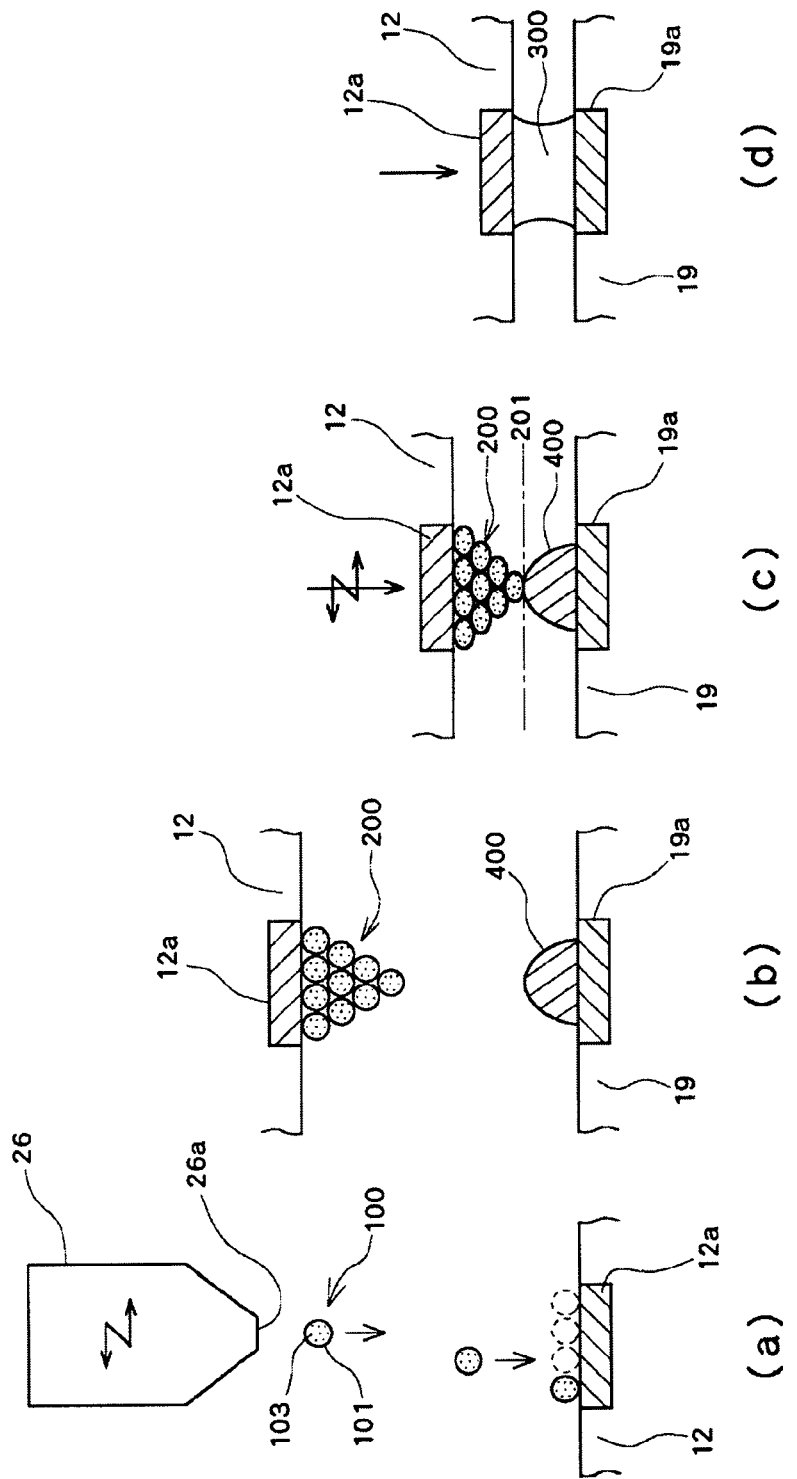
FIG. 14 is an illustrative diagram showing steps of bonding a circuit board and a semiconductor die according to a bonding method of a different exemplary embodiment of the present invention.

Also, although in this exemplary embodiment, it is explained that the bump 200 on each electrode is formed by injecting the microdroplets of the metal nano paste, it is possible that, as shown in FIG. 14, the bump 200 is formed by injecting the microdroplets of the metal nano paste on one of the electrodes of the semiconductor die 12 and the circuit board 19, a metal projection 400 such as a solder bump or a gold bump is formed on the other electrode, and the metal projection 400 and the bump 200 are bonded. In this case, a metal projection forming mechanism that forms a gold bump like a bump bonder, for example, can be incorporated in the bonding apparatus 10, or the metal projection forming mechanism can be provided as a separate apparatus, the semiconductor die 12 or the circuit board 19 on which the metal projection 400 is formed is fed as a workpiece, and then the primary bonding and the secondary bonding can be carried out.

Figure 8:
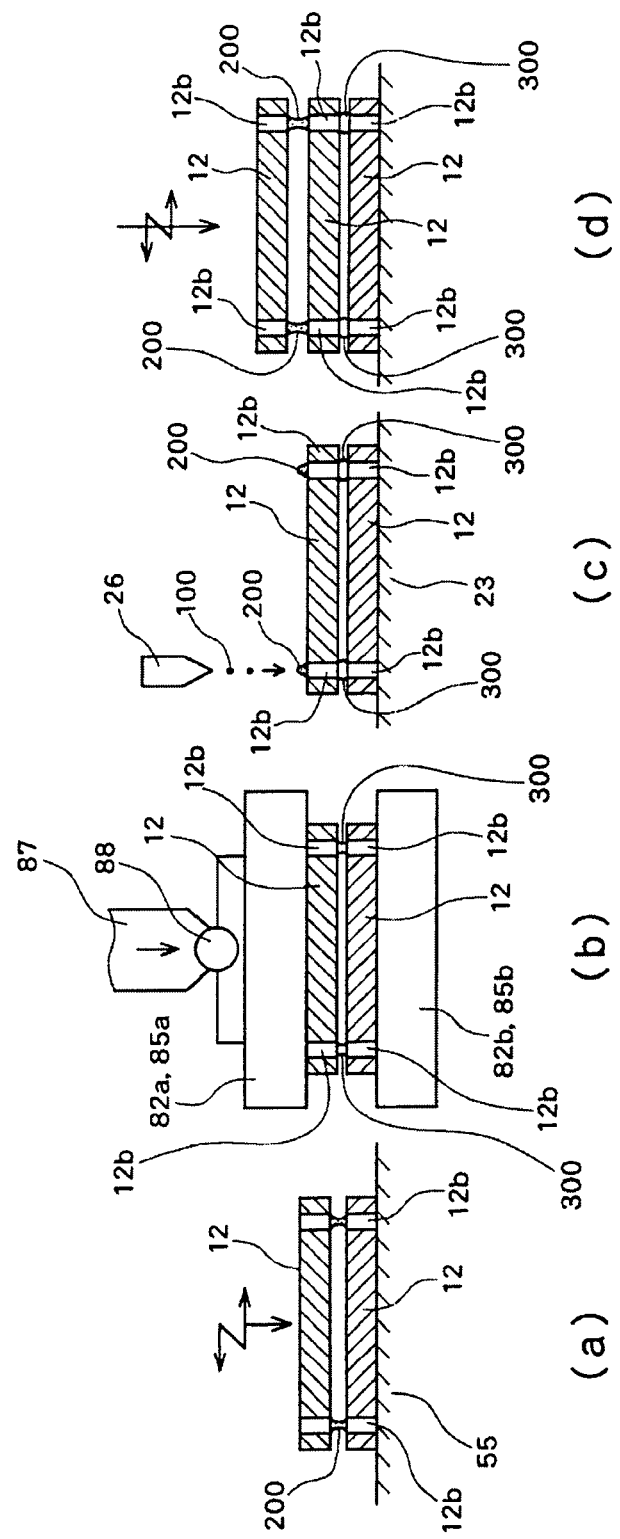
FIG. 8 is an illustrative diagram showing steps of three-dimensional stacking bonding of a semiconductor die according to a bonding method of a different exemplary embodiment of the present invention.

Referring to FIG. 8, another exemplary embodiment is described. The like components as in the exemplary embodiment previously described are indicated by the like numerals and an explanation for such a component is omitted. While the semiconductor die 12 is bonded onto the circuit board 19 in the exemplary embodiment previously described, in this exemplary embodiment, the semiconductor dies 12 are bonded to each other in a three-dimensional manner using the metal nano paste.

As shown in FIG. 8(*a*), each semiconductor die 12 includes a through-hole electrode 12*b*. As previously described referring to FIG. 6, the bump 200 is formed by injecting the microdroplets of the metal nano paste on the through-hole electrode 12*b* of each semiconductor die 12, and one of the semiconductor dies 12 is flipped, and pressed onto the bump 200 formed on the through-hole electrode 12*b* on the semiconductor die 12 suctioned and fixed to the bonding stage 55, and the primary bonding is carried out while vibrating by ultrasonic oscillation.

As shown in FIG. 8(*b*), the semiconductor dies 12 to which the primary bonding has been completed are sandwiched respectively between the upper holding plates 82*a*, 85*a* and the lower holding plates 82*b*, 85*b* of the pressure heating furnace, and pressurized and heated up to 150 degrees Celsius to 250 degrees Celsius, and held for about 60 minutes, thereby carrying out the secondary bonding. The organic substances in the binder are volatilized by the secondary bonding and the dispersant is separated off from the surface of the metal nanoparticles, the metal nanoparticles are bonded to each other to form the metal layer 300, and the through-hole electrodes 12*b* are bonded.

As shown in FIG. 8(*c*), the semiconductor dies 12 to which the secondary bonding has been completed are again transferred to the bump formation mechanism 20, and the bumps 200 are formed by injecting the microdroplets 100 of the metal nano paste from the injection head 26 onto upper surfaces of the through-hole electrodes 12*b* of the secondary bonded semiconductor dies 12. Then, as shown in FIG. 8(*d*), the other semiconductor die 12 in which the bump 200 is formed on the through-hole electrode 12*b* is flipped on the bump 200 formed on the upper surface of the semiconductor die 12 to which the secondary bonding has been completed, thereby carrying out the primary bonding. Then, the semiconductor dies 12 are laminated in a manner that the through-hole electrodes 12*b* are secondary bonded between the lower two semiconductor dies 12 of the three semiconductor dies 12, and the through-hole electrodes are primary bonded between the upper two semiconductor die. The three semiconductor dies 12 in this state are again placed in the pressure heating furnace, and pressurized and heated. As the fusing temperature of the metal layer 300 formed in the secondary bonding is about 1000 degrees Celsius that is about the same as a fusing temperature for common metals, the metal layer 300 is not fused at a heating temperature in the secondary bonding which is 150 degrees Celsius to 250 degrees Celsius and remains a condition as it is. Accordingly, only the bumps 200 that has been primary bonded by pressurizing and heating between the upper two semiconductor dies 12 are pressurized and sintered to form the metal layer 300. Taking advantage of a temperature difference between the fusing temperature of the metal layer 300 thus formed and the heating temperature of the secondary bonding, the semiconductor die 12 is laminated and secondary bonded on the through-hole electrode 12*b* of the semiconductor die 12 that has been previously secondary bonded using the metal nano paste, thereby stacking bonding the semiconductor dies 12.

According to this exemplary embodiment, in addition to the effects of the previously described embodiment, as in a method of stacking bonding the semiconductor dies 12 through the conventional solder bumps, a problem in which the soldering that has been previously bonded is fused and shorted out due to the heating in the bond carried out afterwards does not occur, and it is advantageously possible to carry out stacking bonding of the semiconductor die 12 with high bonding quality and reliability in a three-dimensional manner.

Figure 9:
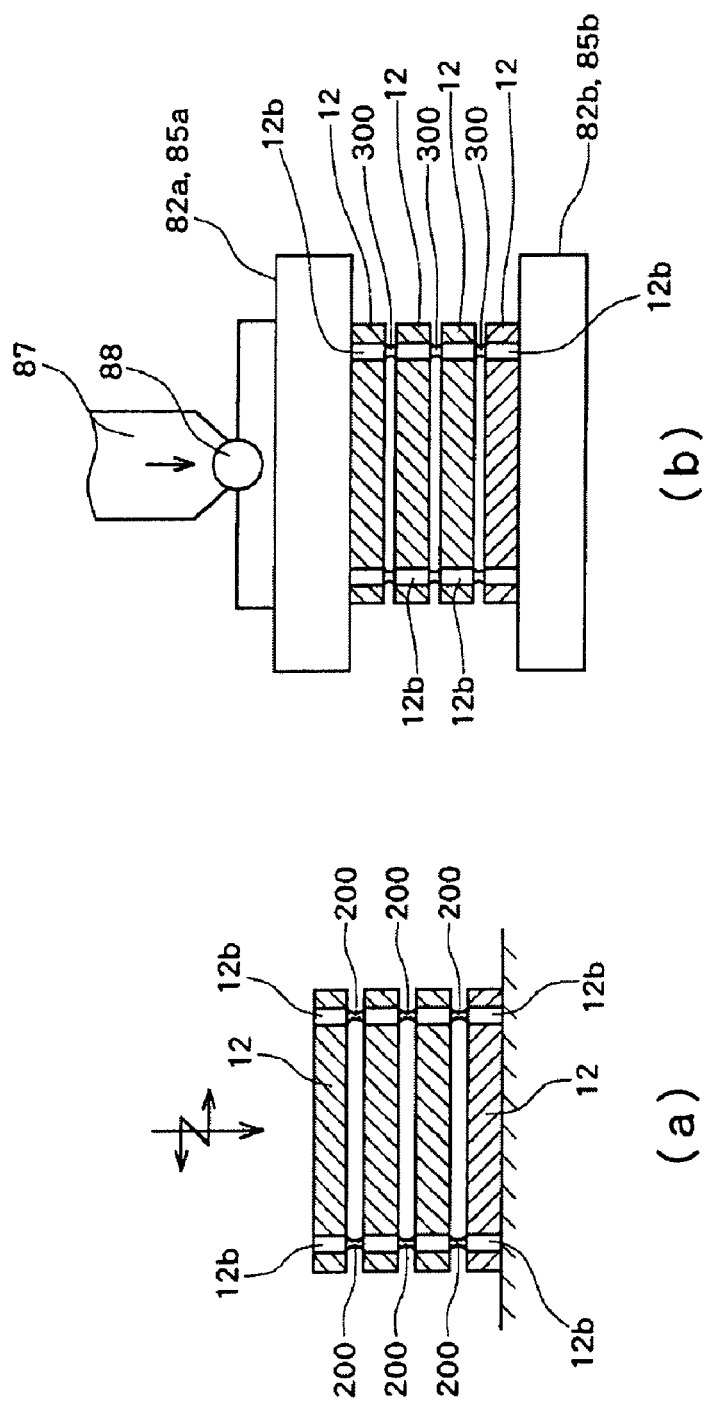
FIG. 9 is an illustrative diagram showing steps of three-dimensional stacking bonding of a semiconductor die according to a bonding method of a different exemplary embodiment of the present invention.

Referring to FIG. 9, another exemplary embodiment is described. In exemplary embodiment, as shown in FIG. 9(*a*), after stacking bonding the plurality of semiconductor dies 12 having the through-hole electrodes 12*b* in the primary bonding, the semiconductor dies 12 that have been stacked and bonded are sandwiched between the upper holding plates 82*a*, 85*a* and lower holding plates 82*b*, 85*b* of the pressure heating furnace, and pressurized and heated up to 150 degrees Celsius to 250 degrees Celsius, and held in this state for about 60 minutes, thereby carrying out the secondary bonding to the bumps 200 of a plurality of stacks at once. The organic substances in the binder are volatilized by the secondary bonding and the dispersant is separated off from the surface of the metal nanoparticles, the metal nanoparticles are bonded to each other to form the metal layer 300, and the all throughhole electrodes 12*b* are bonded and become conductive at the same time.

In this exemplary embodiment, in addition to the effects of the previously described embodiment, as the secondary bonding of the semiconductor dies 12 can be of a plurality of stacks at once. The number of secondary bonding processes can be reduced in comparison with a method in which the secondary bonding is carried out stack by stack. Thus, it is advantageously possible to further reduce the bonding time for a single semiconductor die 12, and to efficiently bond the semiconductor dies 12 in a three-dimensional manner.

Figure 10:
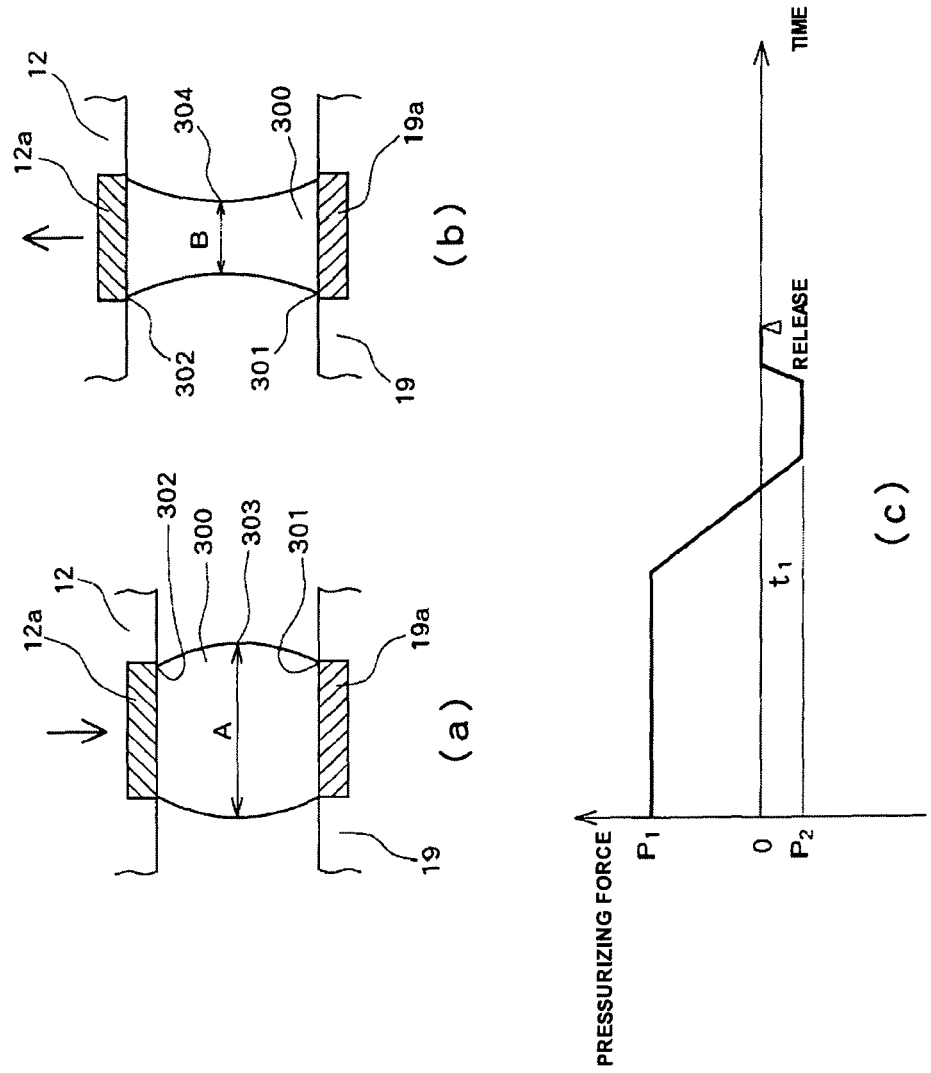
FIG. 10 is an illustrative diagram showing steps of forming a constriction at metal layer a bonding portion according to a bonding method of a different exemplary embodiment of the present invention.
Figure 11:
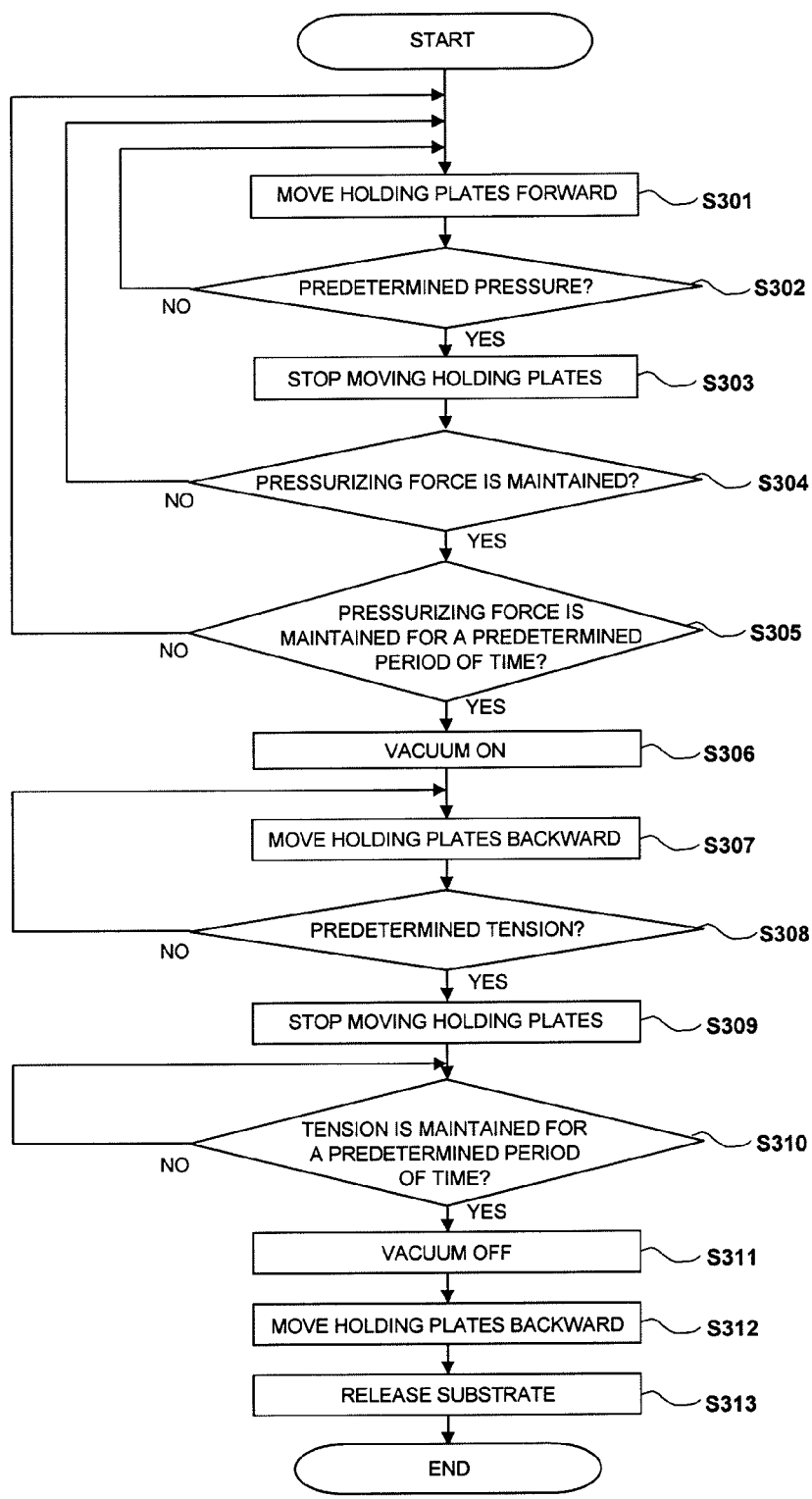
FIG. 11 is an illustrative diagram showing steps of forming a constriction at metal layer a bonding portion according to a bonding method of a different exemplary embodiment of the present invention.

Referring to FIGS. 10 and 11, yet another exemplary embodiment is described. The like components as in the exemplary embodiments previously described are indicated by the like numerals and an explanation for such a component is omitted. Forming the metal layer 300 by the pressurization in the secondary bonding, where the metal layer 300 is barrel shaped and has a large cross section of a central portion 303 between the electrodes 12*a*, 19*a*, as shown in FIG. 10(*a*), depends on the condition of the pressurization and the heating. In contrast, the semiconductor device produces heat when operating and the temperature rises. As the semiconductor die 12 is made of silicon and the circuit board 19 is made of a resin material such as glass epoxy, the temperature rise causes a difference in expansion, which produces a thermal stress in the metal layer 300 that bonds the electrodes 12*a*, 19*a*. When the metal layer 300 is formed in the barrel shape as described above, a maximum stress is produced at a bonding surface 301 with the electrode 19*a* and a bonding surface 302 with the electrode 12*a* at which an area of the cross section of the metal layer 300 is the smallest. As the thermal stress produced at the bonding surfaces 301, 302 is exerted in shear direction of the bonding surfaces 301, 302, a problem can occur such that a crack occurs in the bonding surfaces 301, 302 between the metal layer 300 and the electrodes 12*a*, 19*a*, thereby causing damages or faulty conduction.

In contrast, as shown in FIG. 10(*b*), the metal layer 300 has a shape that includes a constriction 304 at a center, the thermal stress produced due to the difference in expansion is applied to the constriction 304 at the center, and the thermal stress can be absorbed by the constriction 304 being laterally transformed. Accordingly, it is desirable that the metal layer 300 that bonds the electrodes 12*a*, 19*a* has the shape that includes the constriction 304 at a center of the bonding direction. However, it is often difficult to form the constriction 304 without fail when the pressurizing force in the secondary bonding is controlled to be constant.

Therefore, as shown in FIG. 10(*c*), in the middle of the pressurizing processes, the pressurizing force is made negative to apply a tension to the metal layer 300, thereby forming the constriction 304 at the center of the metal layer 300. More specifically, as shown in FIG. 10(*c*), after the sintering of the metal nanoparticles starts by pressurizing and heating, the pressurizing force is reduced to make the pressurizing force negative during a constant time period $t_1$ before the predetermined maintaining time for the secondary bonding ends, and then the secondary bonding of pressurizing and heating is completed.

Referring to FIG. 11 and FIG. 5, the bonding method according to this exemplary embodiment is described. As shown by Step S301 in FIG. 11 and in FIG. 5, the pressurization control unit 503 drives the actuators 83, 86 so that the upper holding plates 82*a*, 85*a* advance to press the semiconductor die 12 against the circuit board 19, pressurize the bumps 200 of the respective electrodes 12*a*, 19*a* in bonding direction. As shown by Step S302 in FIG. 11, the pressurization control unit 503 obtains results measured by a measuring instrument that is not depicted, such as the pressurizing force, or the pressurizing load determined by the number and the shape of the semiconductor dies 12 to be bonded to each of the circuit boards 19, determines if the pressurizing force to the bump 200 has reached the predetermined pressurizing force, and moves the upper holding plates 82*a*, 85*a* forward until the pressurizing force reaches the predetermined pressurizing force. The predetermined pressurizing force is as low as about 1/20 of the pressurizing force required to pressure bond the common metal bumps. Also, the pressurization control unit 503 controls the heater 89 so that the temperature within the pressure heating furnaces 81, 84 is heated up to 150 degrees Celsius to 250 degrees Celsius which is necessary for the secondary bonding. Then, as shown by Step S303 in FIG. 11, the pressurization control unit 503 stops the advancement of the upper holding plates 82*a*, 85*a* when the pressurizing force reaches the predetermined pressure. Then, as shown by Step S304 in FIG. 11, the pressurization control unit 503 obtains results measured by the measuring instrument that is not depicted, such as the applied pressure, or the pressurizing load determined by the number and the shape of the semiconductor dies 12 to be bonded to each of the circuit boards 19, determines if the pressurizing force to the bump 200 has reached the predetermined pressurizing force, and if the pressurizing force has not reached the predetermined pressurizing force, moves the upper holding plates 82*a*, 85*a* forward until the pressurizing force reaches the predetermined pressurizing force, and maintains the pressurizing force at the predetermined pressurizing force.

As shown by Step S305 in FIG. 11, when a predetermined time period, for example, a time period slightly shorter than the common secondary bonding maintaining time as $t_1$ shown in FIG. 10(*c*), has lapsed, the pressurization control unit 503 starts the operation of pulling the sintered metal layer 300.

As shown by Step S306 in FIG. 11 and in FIG. 5, the pressurization control unit 503 evacuates each of the vacuum suction holes 91*a*, 91*b* in the upper holding plates 82*a*, 85*a* and the lower holding plates 82*b*, 85*b*. Then, as shown by Step S307 in FIG. 11, the pressurization control unit 503 drives the actuators 83, 86 so that the upper holding plates 82*a*, 85*a* retreat upward and the semiconductor die 12 is pulled away from the circuit board 19. Then, the semiconductor die 12 and the circuit board 19 that are suctioned respectively to the upper holding plates 82*a*, 85*a* and the lower holding plates 82*b*, 85*b* by vacuum suction are pulled upward and downward, and the tension is added to the metal layer 300 shown in FIG. 10. As shown by Step S308 in FIG. 11, the pressurization control unit 503 obtains results measured by the measuring instrument that is not depicted, such as the pressurizing force, or a tension load determined by the number and the shape of the semiconductor dies 12 to be bonded to each of the circuit boards 19, determines if the tension applied to the sintered metal layer 300 has reached a predetermined tension, and causes the upper holding plates 82*a*, 85*a* to retreat upward until the tension reaches the predetermined tension. Then, As shown by Step S309 in FIG. 11, the pressurization control unit 503 stops the retreat of the upper holding plates 82*a*, 85*a* upward when the tension reaches the predetermined tension, and as shown by Step S310 in FIG. 11, the pressurization control unit 503 maintains the metal layer 300 in a tensile state for a predetermined period of time.

As shown by Step S311 in FIG. 11 and in FIG. 5, the pressurization control unit 503 releases the vacuum of the vacuum suction holes 91a, 91b of the upper holding plates 82a, 85a and the lower holding plates 82b, 85b. By this, the tension applied to the metal layer 300 is released. Then, as shown by Step S312 in FIG. 11, the pressurization control unit 503 causes the upper holding plates 82a, 85a to retreat upward to a predetermined position, and as shown by Step S313 in FIG. 11, releases the circuit board 19 and the semiconductor die 12.

According to this exemplary embodiment, in addition to the effects of the previously described embodiments, by making the applied pressure negative and applying the tension to the metal layer 300 when maintaining the pressurized state as described above, the constriction 304 can be formed at the center of the metal layer 300 in bonding direction. In addition, by the constriction 304, it is advantageously possible to effectively absorb the thermal stress due to the difference in expansion of the semiconductor die 12 and the circuit board 19, and to prevent the faulty conduction from occurring.

Although, in this exemplary embodiment, it is explained that the constriction 304 is formed at the central portion of the metal layer 300 to reduce the thermal stress, the shape of the metal layer 300 is not limited to the constricted shape as long as the thermal stress can be reduced, and, for example, the metal layer can be formed in a different shape such as a high cylindrical shape. When forming the metal layer 300 in a different shape, the pressurizing force can be changed according to the time depending on the shape.

Figure 12:
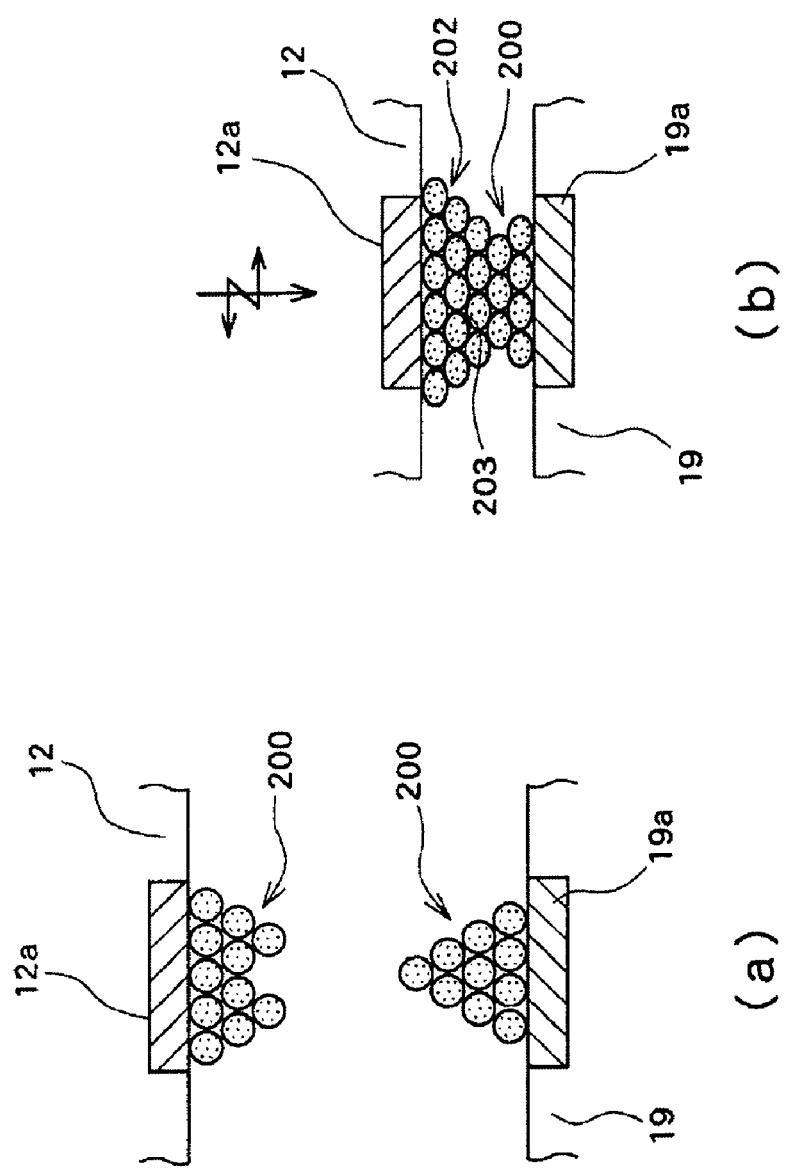
FIG. 12 is an illustrative diagram showing steps of bonding a circuit board and a semiconductor die according to a bonding method of a different exemplary embodiment of the present invention.

Referring to FIG. 12, another exemplary embodiment is described. The like components as in the exemplary embodiment previously described are indicated by the like numerals and an explanation for such a component is omitted. In this exemplary embodiment, a shape of a tip end of the bump formed on each electrode is such that the tip end of one of the bumps to be bonded to each other is recessed and the tip end of the other bump is projected that is engageable with the concave shape.

In the previous embodiments, the shape of the bump formed on each electrode is explained to be a cone shape that is tapered, the shape of the tip end of the bump is not limited to the cone shape. As shown in FIG. 12(a), a bump 202 having a concave tip end can be formed on the electrode 12a of the semiconductor die 12, and the bump 200 having a convex tip end that is engageable with the concave bump 202 formed on the semiconductor die 12 can be formed on the electrode 19a of the circuit board 19. In this manner, by providing the bumps to be bonded to each other serving as a combination of a concavity and convexity that can be engaged, as shown in FIG. 12(b), when primary bonding the bump 202 of the semiconductor die 12 to the bump 200 of the circuit board, an engagement surface 203 formed on a side of each of the bumps 200, 202 can also be brought into contact, the contact between the bumps 200, 202 can be highly increased. Therefore, it is advantageously possible to increase a bonding area of the binder in the primary bonding as well as the bond strength in the primary bonding, and to improve certainty in the primary bonding.

The invention claimed is:

1. A bonding apparatus that bonds an electrode of a semiconductor die with an electrode of a substrate, the apparatus comprising:

a bump formation mechanism that forms a bump on the electrode by injecting microdroplets of a metal nano paste onto the electrode;

a primary bonding mechanism that carries out primary bonding to the electrodes in a non-conductive state by pressing a bump formed by injecting microdroplets of a metal nano paste in which metal nanoparticles surface-coated by a dispersant are contained in a binder in a paste form on one of the electrodes against the other electrode, and by heating each bump up to a predetermined temperature that is higher than a room temperature and lower than the binder removal temperature of the metal nano paste; and a secondary bonding mechanism that includes a pressurizing unit that pressurizes the primary bonded bump in a bonding direction, and that carries out secondary bonding so that the electrodes become conductive by heating the bump up to a temperature higher than a binder removal temperature of the metal nano paste and a dispersant removal temperature of the metal nano paste, thereby removing the binder and the dispersant while pressurizing and sintering the metal nanoparticles in the bump.

2. A bonding apparatus that bonds an electrode of a semiconductor die with an electrode of a substrate, the apparatus comprising:

a bump formation mechanism that forms a bump on the electrode by injecting microdroplets of a metal nano paste onto the electrode;

a primary bonding mechanism that carries out primary bonding to the electrodes in a non-conductive state by pressing bumps formed by injecting microdroplets of a metal nano paste in which metal nanoparticles surface-coated by a dispersant are contained in a binder in a paste form on the electrodes against each other, and by heating each bump up to a predetermined temperature that is higher than a room temperature and lower than the binder removal temperature of the metal nano paste; and a secondary bonding mechanism that includes a pressurizing unit that pressurizes the primary bonded bump in a bonding direction, and that carries out secondary bonding so that the electrodes become conductive by heating the bump up to a temperature higher than a binder removal temperature of the metal nano paste and a dispersant removal temperature of the metal nano paste, thereby removing the binder and the dispersant, while pressurizing and sintering the metal nanoparticles in each bump.

3. A bonding apparatus that bonds semiconductor dies in a three dimensional manner, the apparatus comprising:

a bump formation mechanism that forms a bump on the electrode by injecting microdroplets of a metal nano paste onto the electrode;

a primary bonding mechanism that carries out primary bonding to electrodes in a non-conductive state by pressing a bump formed by injecting microdroplets of a metal nano paste in which metal nanoparticles surface-coated by a dispersant are contained in a binder in a paste form on an electrode of a semiconductor die against a bump formed by injecting microdroplets of the metal nano paste on an electrode of a different semiconductor die, and by heating each bump up to a predetermined temperature that is higher than a room temperature and lower than the binder removal temperature of the metal nano paste; and a secondary bonding mechanism that includes a pressurizing unit that pressurizes the primary bonded bump in bonding direction, and that carries out secondary bonding so that the electrodes become conductive by heating the bump up to a temperature higher than a binder removal temperature of the metal nano paste and a dispersant removal temperature of the metal nano paste, thereby removing the binder and the dispersant while pressurizing and sintering the metal nanoparticles in each bump.

4. The bonding apparatus according to claim 1, wherein the pressurizing unit is provided with holding plates that are disposed so as to face each other and holds one of the semiconductor die and the substrate, a holding plate driving unit that drives at least one of the holding plates to move forward and backward in a bonding direction, and a pressurization control unit that controls the forward and backward movement of the holding plate driving unit, and the pressurization control unit includes pressurizing force changing means that changes the pressurizing force applied to the bump by causing the holding plate driving unit to drive the holding plate forward and backward according to time.

5. The bonding apparatus according to claim 4, wherein the pressurizing force changing means includes constriction formation means that pulls the pressurized and sintered bump in the bonding direction by making the pressurizing force applied to the bump negative after a predetermined period of time elapses, thereby forming a constriction in the bump at a center in the bonding direction.

6. The bonding apparatus according to claim 4, wherein the secondary bonding mechanism is a heating furnace that contains the pressurizing unit that pressurizes the primary bonded bump in the bonding direction.

7. The bonding apparatus according to claim 4, further comprising:

a plurality of secondary bonding mechanisms.

8. A bonding apparatus that bonds an electrode of a semiconductor die with an electrode of a substrate, the apparatus comprising:

a bump formation mechanism that forms a bump on the electrode by injecting microdroplets of a metal nano paste onto the electrode;

a metal projection forming mechanism that forms the metal projection on the electrode;

a primary bonding mechanism that carries out primary bonding to the electrodes in a non-conductive state by pressing a bump formed by injecting microdroplets of a metal nano paste in which metal nanoparticles surface-coated by a dispersant are contained in a binder in a paste form on one of the electrodes against a metal projection formed on the other electrode, and by heating each bump up to a predetermined temperature that is higher than a room temperature and lower than the binder removal temperature of the metal nano paste; and a secondary bonding mechanism that includes a pressurizing unit that pressurizes the primary bonded bump in a bonding direction, and that carries out secondary bonding so that the electrodes become conductive by heating the bump up to a temperature higher than a binder removal temperature of the metal nano paste and a dispersant removal temperature of the metal nano paste, thereby removing the binder and the dispersant while pressurizing and sintering the metal nanoparticles in the bump.

9. The bonding apparatus according to claim 8, wherein the pressurizing unit is provided with holding plates that are disposed so as to face each other and holds one of the semiconductor die and the substrate, a holding plate driving unit that drives at least one of the holding plates to move forward and backward in the bonding direction, and a pressurization control unit that controls the forward and backward movement of the holding plate driving unit, and the pressurization control unit includes pressurizing force changing means that changes the pressurizing force applied to the bump by causing the holding plate driving unit to drive the holding plate forward and backward according to time.

10. The bonding apparatus according to claim 9, wherein the pressurizing force changing means includes constriction formation means that pulls the pressurized and sintered bump in the bonding direction by making the pressurizing force applied to the bump negative after a predetermined period of time elapses, thereby forming a constriction in the bump at a center in the bonding direction.

11. The bonding apparatus according to claim 9, wherein the secondary bonding mechanism is a heating furnace that contains the pressurizing unit that pressurizes the primary bonded bump in the bonding direction.

12. The bonding apparatus according to claim 9, further comprising:

a plurality of secondary bonding mechanisms.

13. A bonding method of bonding an electrode of a semiconductor die with an electrode of a substrate, the method comprising:

a bump formation step of forming a bump on the electrode by injecting microdroplets of a metal nano paste onto the electrode;

a primary bonding step of carrying out primary bonding to the electrodes in a non-conductive state by pressing a bump formed by injecting microdroplets of a metal nano paste in which metal nanoparticles surface-coated by a dispersant are contained in a binder in a paste form on one of the electrodes against the other electrode, and by heating each bump up to a predetermined temperature that is higher than a room temperature and lower than the binder removal temperature of the metal nano paste; and a secondary bonding step of carrying out secondary bonding so that the electrodes become conductive by changing the pressurizing force that pressurizes the primary bonded bump in a bonding direction according to time, heating the bump up to a temperature higher than a binder removal temperature of the metal nano paste and a dispersant removal temperature of the metal nano paste, thereby removing the binder and the dispersant while pressurizing and sintering the metal nanoparticles in the bump.

14. A bonding method of bonding an electrode of a semiconductor die with an electrode of a substrate, the method comprising:

a bump formation step of forming a bump on the electrode by injecting microdroplets of a metal nano paste onto the electrode;

a primary bonding step of carrying out primary bonding to the electrodes in a non-conductive state by pressing bumps respectively formed by injecting microdroplets of a metal nano paste in which metal nanoparticles surface-coated by a dispersant are contained in a binder in a paste form on the electrodes against each other, and by heating each bump up to a predetermined temperature that is higher than a room temperature and lower than the binder removal temperature of the metal nano paste; and a secondary bonding step of carrying out secondary bonding so that the electrodes become conductive by changing the pressurizing force that pressurizes the primary bonded bump in a bonding direction according to time, heating each bump up to a temperature higher than a binder removal temperature of the metal nano paste and a dispersant removal temperature of the metal nano paste, thereby removing the binder and the dispersant while pressurizing and sintering the metal nanoparticles in each bump.

15. A bonding method of bonding semiconductor dies in a three dimensional manner, the method comprising:

a bump formation step of forming a bump on the electrode by injecting microdroplets of a metal nano paste onto the electrode;

a primary bonding step of carrying out primary bonding to electrodes in a non-conductive state by pressing a bump formed by injecting microdroplets of a metal nano paste in which metal nanoparticles surface-coated by a dispersant are contained in a binder in a paste form on an electrode of a semiconductor die against a bump formed by injecting microdroplets of the metal nano paste on an electrode of a different semiconductor die, and by heating each bump up to a predetermined temperature that is higher than room temperature and lower than the binder removal temperature of the metal nano paste; and a secondary bonding step of carrying out secondary bonding so that the electrodes become conductive by changing the pressurizing force that pressurizes the primary bonded bump in a bonding direction according to time, heating each bump up to a temperature higher than a binder removal temperature of the metal nano paste and a dispersant removal temperature of the metal nano paste, thereby removing the binder and the dispersant while pressurizing and sintering the metal nanoparticles in each bump.

16. The bonding apparatus according to claim 13, wherein the secondary bonding step includes pulling of the pressurized and sintered bump in the bonding direction by making the pressurizing force applied to the bump negative after a predetermined period of time elapses, thereby forming a constriction in the bump at a center in the bonding direction.

17. A bonding method of bonding an electrode of a semiconductor die with an electrode of a substrate, the method comprising:

a bump formation step of forming a bump on the electrode by injecting microdroplets of a metal nano paste onto the electrode;

a metal projection formation step of forming the metal projection on the electrode;

a primary bonding step of carrying out primary bonding to the electrodes in a non-conductive state by pressing a bump formed by injecting microdroplets of a metal nano paste in which metal nanoparticles surface-coated by a dispersant are contained in a binder in a paste form on one of the electrodes against a metal projection formed on the other electrode, and by heating each bump up to a predetermined temperature that is higher than a room temperature and lower than the binder removal temperature of the metal nano paste; and a secondary bonding step of carrying out secondary bonding so that the electrodes become conductive by changing the pressurizing force that pressurizes the primary bonded bump in a bonding direction according to time, heating the bump up to a temperature higher than a binder removal temperature of the metal nano paste and a dispersant removal temperature of the metal nano paste, thereby removing the binder and the dispersant while pressurizing and sintering the metal nanoparticles in the bump.

18. The bonding apparatus according to claim 17, wherein the secondary bonding step includes pulling of the pressurized and sintered bump in the bonding direction by making the pressurizing force applied to the bump negative after a predetermined period of time elapses, thereby forming a constriction in the bump at a center in the bonding direction.

19. The bonding apparatus according to claim 2, wherein the pressurizing unit is provided with holding plates that are disposed so as to face each other and holds one of the semiconductor die and the substrate, a holding plate driving unit that drives at least one of the holding plates to move forward and backward in a bonding direction, and a pressurization control unit that controls the forward and backward movement of the holding plate driving unit, and the pressurization control unit includes pressurizing force changing means that changes the pressurizing force applied to the bump by causing the holding plate driving unit to drive the holding plate forward and backward according to time.

20. The bonding apparatus according to claim 3, wherein the pressurizing unit is provided with holding plates that are disposed so as to face each other and holds one of the semiconductor die and the substrate, a holding plate driving unit that drives at least one of the holding plates to move forward and backward in a bonding direction, and a pressurization control unit that controls the forward and backward movement of the holding plate driving unit, and the pressurization control unit includes pressurizing force changing means that changes the pressurizing force applied to the bump by causing the holding plate driving unit to drive the holding plate forward and backward according to time.

21. The bonding apparatus according to claim 19, wherein the pressurizing force changing means includes constriction formation means that pulls the pressurized and sintered bump in the bonding direction by making the pressurizing force applied to the bump negative after a predetermined period of time elapses, thereby forming a constriction in the bump at a center in the bonding direction.

22. The bonding apparatus according to claim 20, wherein the pressurizing force changing means includes constriction formation means that pulls the pressurized and sintered bump in the bonding direction by making the pressurizing force applied to the bump negative after a predetermined period of time elapses, thereby forming a constriction in the bump at a center in the bonding direction.

23. The bonding apparatus according to claim 19, wherein the secondary bonding mechanism is a heating furnace that contains the pressurizing unit that pressurizes the primary bonded bump in the bonding direction.

24. The bonding apparatus according to claim 20, wherein the secondary bonding mechanism is
a heating furnace that contains the pressurizing unit that pressurizes the primary bonded bump in the bonding direction.

25. The bonding apparatus according to claim 19, further comprising:
a plurality of secondary bonding mechanisms.

26. The bonding apparatus according to claim 20, further comprising:
a plurality of secondary bonding mechanisms.

27. The bonding apparatus according to claim 14, wherein the secondary bonding step includes pulling of the pressurized and sintered bump in the bonding direction by making the pressurizing force applied to the bump negative after a predetermined period of time elapses, thereby forming a constriction in the bump at a center in the bonding direction.

28. The bonding apparatus according to claim 15, wherein the secondary bonding step includes pulling of the pressurized and sintered bump in the bonding direction by making the pressurizing force applied to the bump negative after a predetermined period of time elapses, thereby forming a constriction in the bump at a center in the bonding direction.

\* \* \* \* \*